US011520953B2

(12) United States Patent
Lill et al.

(10) Patent No.: US 11,520,953 B2
(45) Date of Patent: Dec. 6, 2022

(54) PREDICTING ETCH CHARACTERISTICS IN THERMAL ETCHING AND ATOMIC LAYER ETCHING

(71) Applicant: Lam Research Corporation, Fremont, CA (US)

(72) Inventors: Thorsten Lill, Santa Clara, CA (US); Andreas Fischer, Castro Valley, CA (US); Ivan L. Berry, III, San Jose, CA (US); Nerissa Sue Draeger, Fremont, CA (US); Richard A. Gottscho, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 1225 days.

(21) Appl. No.: 15/970,744

(22) Filed: May 3, 2018

(65) Prior Publication Data

US 2019/0340316 A1    Nov. 7, 2019

(51) Int. Cl.
*G06F 30/20* (2020.01)
*G06N 10/00* (2022.01)
*G06N 20/00* (2019.01)

(52) U.S. Cl.
CPC ............ *G06F 30/20* (2020.01); *G06N 10/00* (2019.01); *G06N 20/00* (2019.01)

(58) Field of Classification Search
CPC ......... G06F 30/20; G06N 10/00; G06N 20/00
See application file for complete search history.

(56) References Cited

U.S. PATENT DOCUMENTS 10,846,448 B1 * 11/2020 Pikus .................... G06N 10/00
2013/0013253 A1    1/2013 Samukawa et al.
(Continued)

FOREIGN PATENT DOCUMENTS

JP    2010232594 A    10/2010
JP    2015213020 A    11/2015

OTHER PUBLICATIONS

Lee, et al., "Thermal Atomic Layer Etching of Titanium Nitride Using Sequential, Self-Limiting Reactions: Oxidation to $TiO_2$ and Fluorination to Volatile $TiF_4$," Chem. Mater., Sep. 12, 2017, vol. 29, pp. 8202-8210.

(Continued)

*Primary Examiner* — Robert G Bachner
(74) *Attorney, Agent, or Firm* — Weaver Austin Villeneuve & Sampson LLP

(57) ABSTRACT

Etch in a thermal etch reaction is predicted using a machine learning model. Chemical characteristics of an etch process and associated energies in one or more reaction pathways of a given thermal etch reaction are identified using a quantum mechanical simulation. Labels indicative of etch characteristics may be associated with the chemical characteristics and associated energies of the given thermal etch reaction. The machine learning model can be trained using chemical characteristics and associated energies as independent variables and labels as dependent variables across many different etch reactions of different types. When chemical characteristics and associated energies for a new thermal etch reaction are provided as inputs in the machine learning model, the machine learning model can accurately predict etch characteristics of the new thermal etch reaction as outputs.

27 Claims, 12 Drawing Sheets

(56) References Cited

U.S. PATENT DOCUMENTS

2017/0176983 A1    6/2017   Tetiker et al.
2017/0371991 A1   12/2017   Tetiker et al.

OTHER PUBLICATIONS

DuMont, et al., "Thermal Atomic Layer Etching of SiO2 by a "Conversion-Etch" Mechanism Using Sequential Reactions of Trimethylaluminum and Hydrogen Fluoride," ACS Appl. Mater. Interfaces, Feb. 27, 2017, vol. 9, pp. 10296-10307.
Lee, et al., "Selectivity in Thermal Atomic Layer Etching Using Sequential, Self-Limiting Fluorination and Ligand-Exchange Reactions," Chem. Mater., Oct. 4, 2016, vol. 28, pp. 7657-7665.
International Preliminary Report on Patentability dated Nov. 12, 2020 WO Application PCT/US2019/028780.
International Search Report and Written Opinion dated Sep. 6, 2019 WO Application PCT/US2019/028780.

* cited by examiner

Ligand Exchange

| Reaction Product | ΔE (111) | ΔE (211) | ΔE (311) | ΔE (121) | ΔE (221) | ... |
|---|---|---|---|---|---|---|
| Product A (e.g., triple bridge) | ... | ... | ... | ... | ... | ... |
| Product B (e.g., double bridge) | ... | ... | ... | ... | ... | ... |
| Product C (e.g., single bridge) | ... | ... | ... | ... | ... | ... |
| ... | ... | ... | ... | ... | ... | ... |
| Feature Vectors | FV (111) – ranking of products by ΔE if they are stable | FV (211) – difference due to difference in model | | | | |

FIGURE 6B

| Surface Layer / Etch Precursor | $S_xT_y$ | ... | ... | new |
|---|---|---|---|---|
| $M_xN_y$ | FV (ijk) | FV (i'j'k') | FV (ijk) | |
| ... | FV (i'j'k') | FV (ijk) | FV (i'j'k') | |
| ... | FV (i'j'k') | FV (i'j'k') | FV (ijk) | |
| new | | | | FV (i'j'k') |

FIGURE 9

PREDICTING ETCH CHARACTERISTICS IN THERMAL ETCHING AND ATOMIC LAYER ETCHING

BACKGROUND

Semiconductor fabrication processes include etching of various materials. Different types of etching can be utilized to etch materials from a substrate surface, including thermal etching and chemical etching. As feature sizes shrink and the need for atomic scale processing increases, a thermal or chemical etch can be an atomic layer etch (ALE). An etch precursor may or may not react with the substrate surface to etch certain materials from the substrate surface. Predicting whether the etch precursor and materials on the substrate surface will etch is challenging.

SUMMARY

Provided herein is a method for predicting an etch characteristic in a reaction between a surface layer and an etch precursor. The method includes: (a) identifying chemical characteristics and associated energies for one or more reaction pathways in a simulated reaction between the surface layer and the etch precursor using a quantum mechanical model, (b) providing the chemical characteristics and associated energies in the simulated reaction as inputs into a machine learning model, and (c) determining an etch characteristic for the simulated reaction between the surface layer and the etch precursor using the machine learning model.

In some implementations, the chemical characteristics and associated energies for the one or more reaction pathways in the simulated reaction are determined using the quantum mechanical model configured with a selected surface representation of the surface layer and one or more selected initial conditions. In some implementations, the one or more selected initial conditions include a separation distance between the surface layer and the etch precursor at an onset of the simulated reaction, an orientation and/or direction of the surface layer and the etch precursor at the onset of the simulated reaction, a form of an initial chemical bridge between the surface layer and the etch precursor at the onset of the simulated reaction, an internal or kinetic energy of the etch precursor or the surface layer at the onset of the simulated reaction, or combinations thereof. In some implementations, the selected surface representation of the surface layer is selected from a group consisting of: a molecule, a small cluster of molecules, and a large cluster of molecules. In some implementations, the quantum mechanical model includes a density functional theory (DFT) model, a Hartree-Fock model, a semi-empirical model, or combinations thereof. In some implementations, the chemical characteristics include bonding configurations or molecular structures of one or more reaction intermediates and/or products produced in the one or more reaction pathways. The bonding configurations or molecular structures may include one or more of a single bridge dimer, a double bridge dimer, a triple bridge dimer, and no dimer. In some implementations, the etch characteristic for the simulated reaction includes an etch rate of the surface layer. In some implementations, the method further includes organizing the chemical characteristics and the associated energies for the one or more reaction pathways of the simulated reaction into a feature vector. In some implementations, the machine learning model was trained using a training set comprising a plurality of training set members, each training set member comprising (i) a feature vector containing chemical characteristics and associated energies for intermediates and/or products produced in one or more reaction pathways for a thermal etch reaction simulated by at least one quantum mechanical simulation, and (ii) a label representing a characteristic of the thermal etch reaction. In some implementations, the method further includes identifying one or more candidate thermal etch reactions using the machine learning model, where each of the one or more identified candidate thermal etch reactions includes at least an identified etch precursor. Each of the one or more identified candidate thermal etch reactions may further include an identified material to be etched by the identified etch precursor, an identified etch mask material, and/or an identified chamber material.

Another aspect involves a method of generating a machine learning model for use in predicting etch information in a thermal etch reaction. The method includes performing at least one quantum mechanical simulation for each of a plurality of thermal etch reactions, each quantum mechanical simulation generating chemical characteristics and associated energies for one or more reaction pathways in a corresponding thermal etch reaction between a surface layer and an etch precursor, determining, for each of the plurality of thermal etch reactions, an experimentally determined etch characteristic, generating a training set comprising a plurality of training set members, each training set member comprising (i) at least one feature vector containing the chemical characteristics and associated energies for intermediates and/or products produced in the one or more reaction pathways for the corresponding thermal etch reaction, and (ii) a label representing the experimentally determined etch characteristic, and generating the machine learning model trained using the training set, where the machine learning model is configured to predict the etch information in the thermal etch reaction.

In some implementations, performing the at least one quantum mechanical simulation includes performing multiple quantum mechanical simulations for each of the plurality of thermal etch reactions, and where each feature vector contains the chemical characteristics and associated energies for intermediates and/or products produced in the one or more reaction pathways from one of the multiple quantum mechanical simulations of the corresponding thermal etch reaction. In some implementations, each of the at least one quantum mechanical simulation includes a quantum mechanical model configured with a surface representation of the surface layer and one or more initial conditions. In some implementations, the one or more initial conditions include a separation distance between the surface layer and the etch precursor at an onset of the quantum mechanical simulation, an orientation and/or direction of the surface layer and the etch precursor at the onset of the quantum mechanical simulation, a form of an initial chemical bridge between the surface layer and the etch precursor at the onset of the quantum mechanical simulation, an internal or kinetic energy of the etch precursor or the surface layer at the onset of the quantum mechanical simulation, or combinations thereof. In some implementations, the surface representation of the surface layer is selected from a group consisting of: a molecule, a small cluster of molecules, and a large cluster of molecules. In some implementations, the quantum mechanical model includes a density functional theory (DFT) model, a Hartree-Fock model, a semi-empirical model, or combinations thereof. In some implementations, the chemical characteristics include bonding configurations or molecular structures of the intermediates and/or products produced in the one or more reaction pathways. The bonding configurations or molecular structures may include one or more of a single bridge dimer, a double bridge dimer, a triple bridge dimer, and no dimer. In some implementations, generating the training set includes organizing the chemical characteristics and associated energies for the one or more reaction pathways in the corresponding thermal etch reaction into the at least one feature vector, and organizing the experimentally determined etch characteristic into the label.

These and other aspects are described further below with reference to the drawings.

BRIEF DESCRIPTION OF THE DRAWINGS

FIG. 6B shows a table of generated feature vectors from various quantum mechanical simulations run in FIG. 6A for the reaction between the surface layer and the etch precursor according to some implementations.

FIG. 9 shows a table of feature vectors for different thermal etch reactions with identified etch precursors and identified surface layers for designing candidate thermal etch reactions according to some implementations.

DETAILED DESCRIPTION

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

Thermal Etching

Thermal etching uses gas-phase reagents to react with a substrate surface and to etch materials from the substrate surface chemically and/or thermally. As used herein, thermal etching may also be referred to as "chemical etching" and vice versa. Thermal etching can be applied over a wide range of materials. Selectivity may be desired in thermal etch reactions so that one material is removed in the presence of other materials. Selectivity in etching has many applications in semiconductor device fabrication and surface cleaning. The selectivity may be higher in thermal etching compared to other conventional etching techniques, such as plasma etching or sputtering.

Figure 1A:
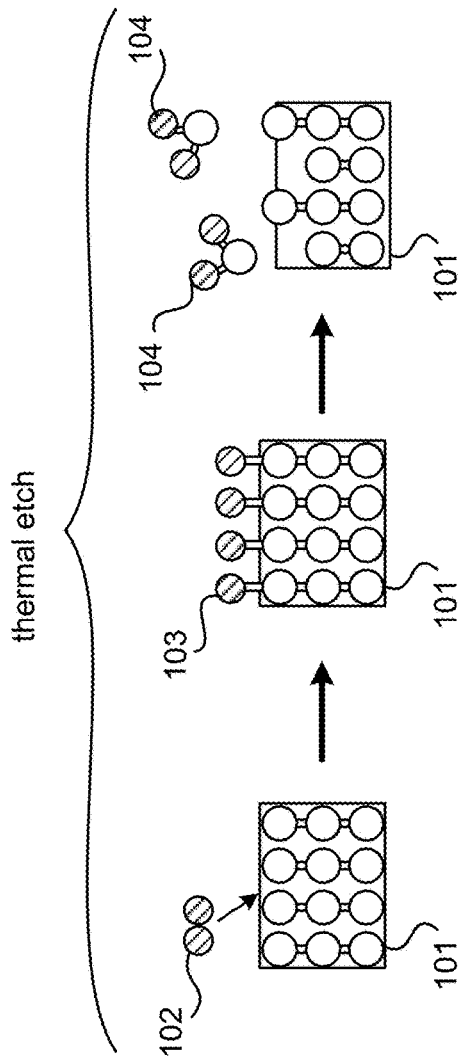
FIG. 1A is a schematic illustration of an example of a non-self-limiting thermal etch process.

Thermal etching generally involves a solid etch material and a gaseous etch precursor. An etch precursor is any reactant gas in a thermal etch reaction that reacts with the solid etch material to facilitate removal of the solid etch material from a substrate surface. In some implementations, an etch precursor may modify a surface layer of the substrate surface, and thermal energy may be applied to etch the modified surface layer. An example of this process is shown in FIG. 1A. In some implementations, an etch precursor may react with a modified surface layer and etch the modified surface layer by thermal and/or chemical energy. An example of this process is shown in FIG. 1B.

Thermal etch processes may broadly be categorized as continuous (non-self-limiting) or non-continuous (self-limiting). Self-limiting thermal etch processes can include thermal atomic layer etch (ALE) processes, where an example thermal ALE process can involve ligand exchange reactions.

FIG. 1A is a schematic illustration of an example of a non-self-limiting thermal etch process. An initial step of the non-self-limiting thermal etch process involves delivery of an etch precursor 102 towards a solid material 101 of a surface layer to be etched. During a modification step of the non-self-limiting thermal etch process, the etch precursor 102 adsorbs onto the solid material 101 of the surface layer to form a modified surface layer 103. Subsequently, during a removal step of the non-self-limiting thermal etch process, thermal energy is applied to the solid material 101 to cause desorption of a volatile reaction product 104 and remove the modified surface layer 103.

Figure 1B:
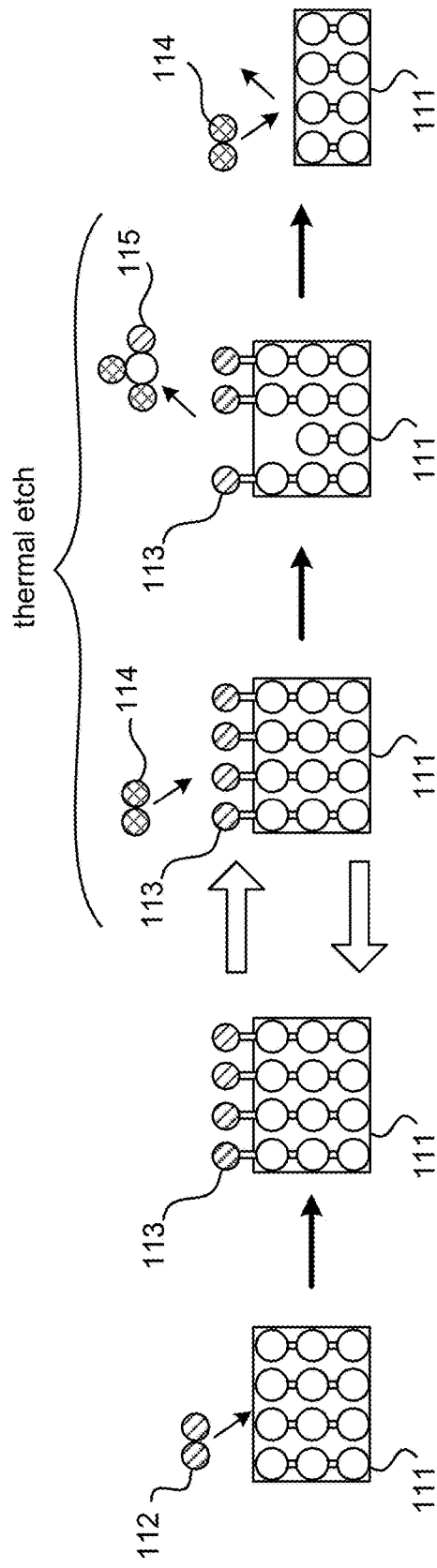
FIG. 1B is a schematic illustration of an example of a self-limiting thermal etch process.

FIG. 1B is a schematic illustration of an example of a self-limiting thermal etch process. The self-limiting thermal etch process in FIG. 1B may be described as a thermal ALE process that may involve multiple ALE cycles. ALE is a technique that removes thin layers of material using sequential self-limiting reactions. Generally, an "ALE cycle" is the minimum set of operations used to perform an etch process one time, such as etching a monolayer. The result of one cycle is that at least some of a surface layer of a substrate is etched. Typically, an ALE cycle includes a modification operation and a removal operation. The ALE cycle may include ancillary operations, such as sweeping one of the reactants or byproducts. As an example, an ALE cycle may include the following operations: (i) delivery of a modifying precursor or reactant gas into a chamber, (ii) purging of the modifying precursor from the chamber, (iii) delivery of an etch precursor or removal gas into the chamber, and (iv) purging of the chamber.

An initial step of the self-limiting thermal etch process involves delivery of a modifying precursor 112 towards a solid material 111 of a surface layer to be etched. By way of an example, the solid material 111 can include crystalline aluminum oxide ($Al_2O_3$) and the modifying precursor 112 can include hydrogen fluoride (HF). In some implementations, the modifying precursor 112 can include gaseous species or plasma species, where plasma species may include fluorine radicals in the modifying precursor 112. Accordingly, modification may be conducted in the presence of plasma or other source of energy beyond merely thermal energy. The modifying precursor 112 is adsorbed onto the surface of the solid material 111 to form a modified surface layer 113. A material of the modified surface layer 113 may not be volatile or at least not volatile at a given temperature. The initial step of the self-limiting thermal etch process may be referred to as a "modification" step. In some implementations, the modification step may be followed by a purge step to purge the modifying precursor 112.

A subsequent step of the self-limiting thermal etch process involves etching of the modified surface layer 113 using an etch precursor 114. The etch precursor 114 reacts with the modified surface layer 113 to convert at least some of the modified surface layer 113 to a volatile product 115. By way of an example, the etch precursor 114 includes trimethylaluminum (TMA) and the modified surface layer 113 includes aluminum trifluoride ($AlF_3$). The TMA may accept fluorine atoms from $AlF_3$ and the TMA donates $CH_3$ molecules to produce a volatile product 115 that includes aluminum dimethyl fluoride ($AlF(CH_3)_2$). Whereas $AlF_3$ requires high temperatures for desorption from the modified surface layer 113, $AlF(CH_3)_2$ requires lower temperatures (e.g., room temperature) for desorption from the modified surface layer 113 to take place. In other words, introduction of the etch precursor 114 that reacts with the modified surface layer 113 may reduce a process temperature for desorption to take place. Removal of the modified surface layer 113 using the etch precursor 114 takes places in a self-limiting manner. An appropriate temperature and the etch precursor 114 are chosen to selectively react with the modified surface layer 113 and remove such layer 113 without reacting with the bulk layer or the remainder of the solid material 111. This subsequent step in the thermal etch process may be referred to as a "removal" step or "etch" step. In some implementations, the removal step may be followed by a purge step to remove excess etch precursor 114 and the volatile product 115. The modification step and the removal step may be cycled repeatedly to remove the solid material 111 on a layer-by-layer basis until a desired depth or amount is reached.

Figure 1C:
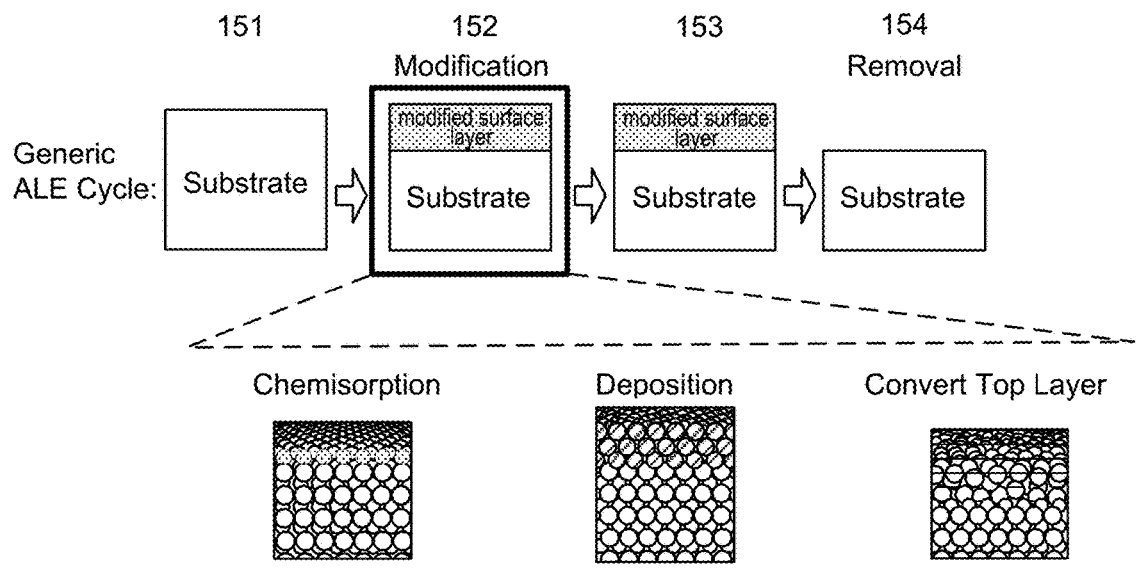
FIG. 1C shows schematic illustrations of different modification mechanisms in a modification operation of atomic layer etch.
Figure 1D:
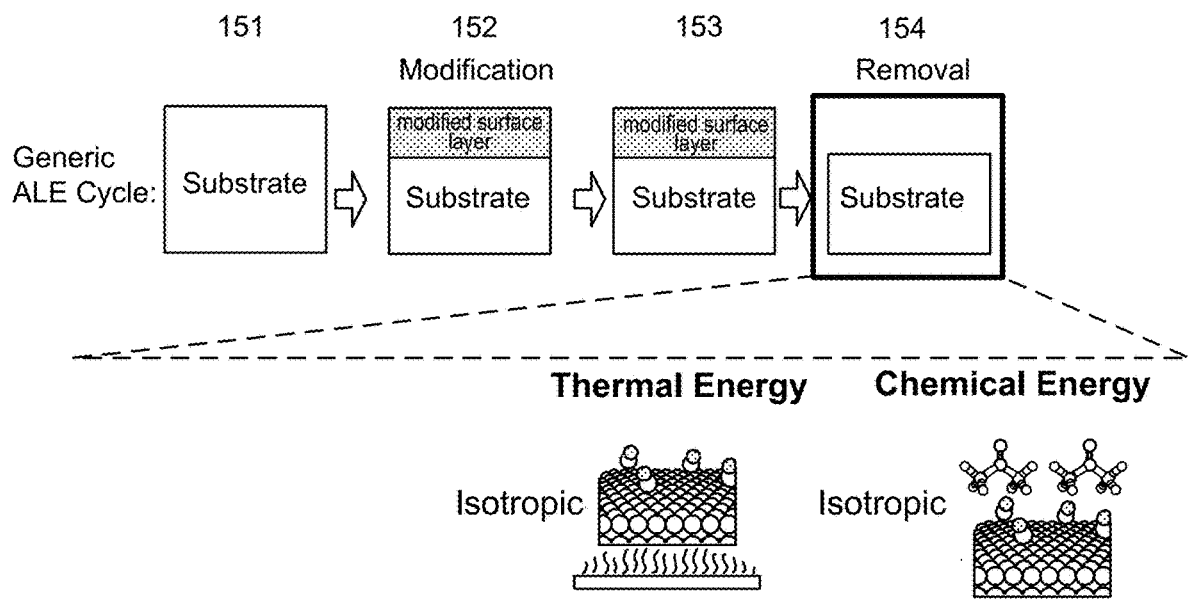
FIG. 1D shows schematic illustrations of different removal mechanisms in a removal operation of isotropic atomic layer etch.

A typical thermal ALE process can include a modification step and a removal step. FIG. 1C shows schematic illustrations of different modification mechanisms in a modification operation of ALE. FIG. 1D shows schematic illustrations of different removal mechanisms in a removal operation of isotropic ALE. In FIGS. 1C-1D, diagrams 151-154 show a generic ALE cycle. In 151, a substrate is provided. In 152, the surface of the substrate is modified. In 153, the next step is prepared. In 154, the modified layer is being etched and ultimately removed. A cycle may only partially etch about 0.1 nm to about 50 nm of material, or between about 0.1 nm and about 5 nm of material, or between about 0.2 nm and about 50 nm of material, or between about 0.2 nm and about 5 nm of material. The amount of material etched in a cycle may vary. For example, if ALE is integrated with atomic layer deposition (ALD) used to protect sidewalls, then an ALE cycle may remove less material compared to if ALE is not integrated with ALD.

FIG. 1C illustrates different mechanisms to modify a surface in ALE: (a) chemisorption, (b) deposition, and (c) conversion. In chemisorption, a modifying precursor may react with the surface of the substrate to form an adsorption-limited amount of material that bonds with the surface of the substrate. In deposition, a thin layer of material may be deposited on the surface of the substrate prior to removal. In conversion, a salt is formed with atoms at the top of the substrate to form essentially a barrier layer to prevent further reaction. The salt may be subsequently removed by a subsequent thermal or chemical operation. In FIG. 1C, reactants used in modifying the surface may be delivered by gases, plasma, wet (liquid) chemistry, or other sources.

FIG. 1D illustrates different mechanisms to isotropically remove a modified surface in ALE: (a) thermal energy, and (b) chemical energy. With thermal energy, the removal step of ALE may be accomplished purely by adjusting a temperature to cause desorption of a modified surface layer without any further chemical reaction. With chemical energy, the removal step of ALE may be accomplished by reacting a gaseous precursor with the modified surface layer to cause desorption of the modified surface layer without changing a temperature. Even though temperature may be unchanged with chemical energy, the ALE reaction is understood as a type of thermal etch reaction. With thermal and chemical energy, the removal step of ALE may be accomplished by reacting a gaseous precursor with the modified surface layer and applying a desired temperature to cause desorption of the modified surface layer.

Resources may be limited in experimenting, exploring, calculating, researching, and manually determining etch characteristics in a thermal etch reaction. A machine learning model of the present disclosure is configured to predict etch characteristics in a thermal etch reaction. The thermal etch reaction includes at least an etch precursor and a surface layer or modified surface layer. It will be understood that the machine learning model of the present disclosure may be applied to continuous or non-continuous thermal etching. It will also be understood that the machine learning model of the present disclosure may be applied to an ALE reaction, specifically the removal step in the ALE reaction, whether thermal energy and/or chemical energy is used to remove a modified surface layer. The machine learning model of the present disclosure may not only reduce time, cost, and resources, but may facilitate design of new thermal etch reactions and chemistries.

Representation of a Thermal Etch Reaction

Generally, a thermal etch reaction is considered to be a conversion of reactants, including a surface layer and an etch precursor, into products which are volatile. If the products formed are volatile, then an etch precursor etches the surface layer. Etching results may be explained by the stability and volatility of the products. Determining the stability of the volatile products may be determined from understanding the reaction pathways and energies associated with the reactants, intermediates, and/or products in the reaction pathways.

Figure 2:
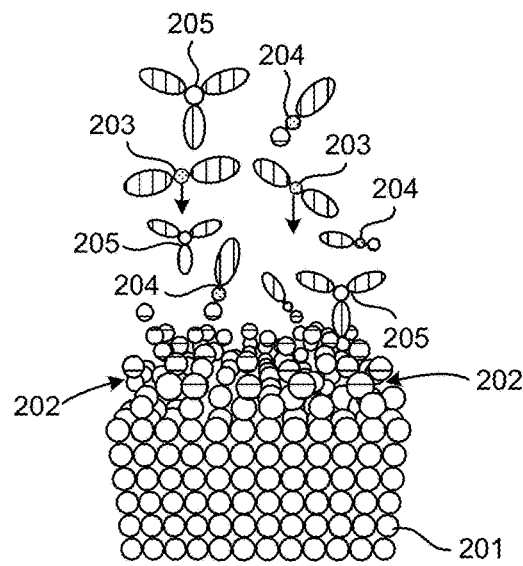
FIG. 2 shows a schematic illustration of an example ligand exchange reaction in an atomic layer etch.
Figure 2:
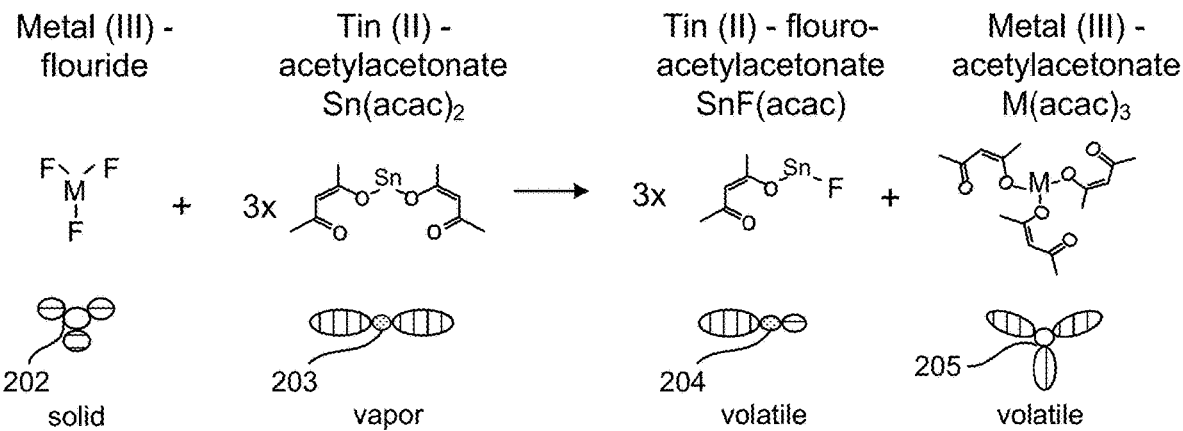

By way of an example, a thermal etch reaction may include one or more ligand-exchange reactions. A ligand exchange reaction is one type of reaction pathway, in which a ligand in a compound is replaced by another via ligand substitution. FIG. 2 shows a schematic illustration of an example ligand exchange reaction in ALE. A substrate can include a bulk material 201 such as a metal oxide (e.g., aluminum oxide). A surface of the substrate may be fluorinated to form a modified surface layer, where the modified surface layer includes a metal fluoride 202 (e.g., aluminum fluoride). A metal precursor 203 in a vapor phase may flow towards the substrate to react with the modified surface layer, where the metal precursor 203 includes tin (II) acetylacetonate ($Sn(acac)_2$). The metal precursor 203 serves as an etch precursor. The metal precursor 203 may accept fluorine atoms from the metal fluoride 202 and donate acetylacetonate (acac) molecules to form volatile products. In other words, the metal precursor 203 swaps ligands with the metal fluoride 202. The ligand exchange forms a first volatile product 204, which is tin (II) fluoro-acetylacetonate (SnF (acac)), and forms a second volatile product 205, which is metal (III) acetylacetonate ($M(acac)_3$). The first volatile product 204 and the second volatile product 205 desorb from the surface of the substrate so that the bulk material 201 is etched in a self-limiting manner. The ligand exchange may be facilitated by the ability of fluorine to form stable bridges with tin, and the ability of the acetylacetonate ligand to form stable metal acetylacetonate compounds.

The conversion of the reactants to the one or more volatile products involves one or more reaction pathways. Each reaction pathway includes two or more reactants, one or more intermediates, and one or more products. Each reaction pathway may represent a possible reaction mechanism by which the overall thermal etch reaction occurs. Specifically, a reaction pathway may be represented by discrete intermediate compounds and their associated energies. In addition or in the alternative, a reaction pathway may be represented by a reaction coordinate that includes not only discrete intermediate compounds but all intermediate states between the discrete intermediate compounds. Such discrete intermediate states may represent various molecular configurations, inter-molecular conformations, inter-molecular orientations, bond lengths, etc. The discrete intermediate compounds may be formed at different steps in a reaction pathway, where each step in the reaction pathway may have its own associated change in energy ($\Delta E$). The energy may be considered a thermodynamic property such as a ground state energy.

Predicting etch characteristics in a thermal etch reaction may depend on a reaction pathway of the thermal etch reaction, and whether certain intermediate states or products are thermodynamically or energetically favorable in the reaction pathway. Put another way, a reaction pathway and the associated energies of the reactants, intermediates, and products in the reaction pathway may determine whether reactants in a thermal etch reaction convert to volatile products or not.

Figure 3A:
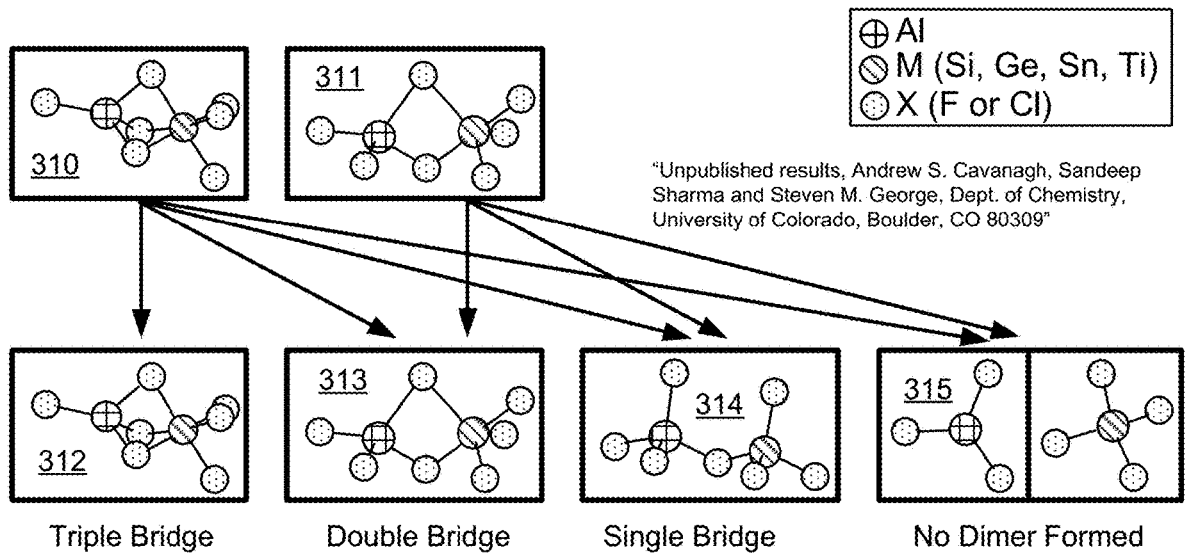
FIG. 3A shows schematic illustrations of possible minimum energy isomers in an example reaction between aluminum fluoride and a metal chloride.

FIG. 3A shows schematic illustrations of possible minimum energy isomers in an example reaction between aluminum fluoride and a metal chloride. The possible minimum energy isomers may be generated by running a simulation of the example reaction between aluminum fluoride and the metal chloride. The reaction between these two molecules, namely the aluminum fluoride and the metal chloride, may result in discrete intermediate and/or product compounds in one or more reaction pathways, where each of the discrete intermediate and/or product compounds has a unique bonding configuration or molecular structure. The example reaction may be simulated in a first simulation 310 and a second simulation 311. The first simulation 310 in FIG. 3A permits a triple bridge bonding configuration between the aluminum atom in the aluminum fluoride and the metal atom in the metal chloride. The second simulation 311 in FIG. 3A permits a double bridge bonding configuration between the aluminum atom in the aluminum fluoride and the metal atom in the metal chloride. In FIG. 3A, a "triple bridge" indicates three halide atoms, including fluorine atoms and/or chlorine atoms, form bridges connecting the aluminum atom and the metal atom. A "double bridge" indicates two halide atoms. A "single bridge" indicates one halide atom. A "no dimer" indicates no bridge connects the aluminum atom and the metal atom. As shown in FIG. 3A, the first simulation 310 permitting a triple bridge configuration generates a triple bridge isomer 312, a double bridge isomer 313, a single bridge isomer 314, and no dimer 315 as possible intermediate and/or product compounds. The second simulation 311 permitting a double bridge configuration generates the double bridge isomer 313, the single bridge isomer 314, and no dimer 315 as possible intermediate and/or product compounds. A simulation, such as a quantum mechanical simulation as discussed below, of a thermal etch reaction can generate possible intermediate and/or product compounds produced in one or more reaction pathways.

Figure 3B:
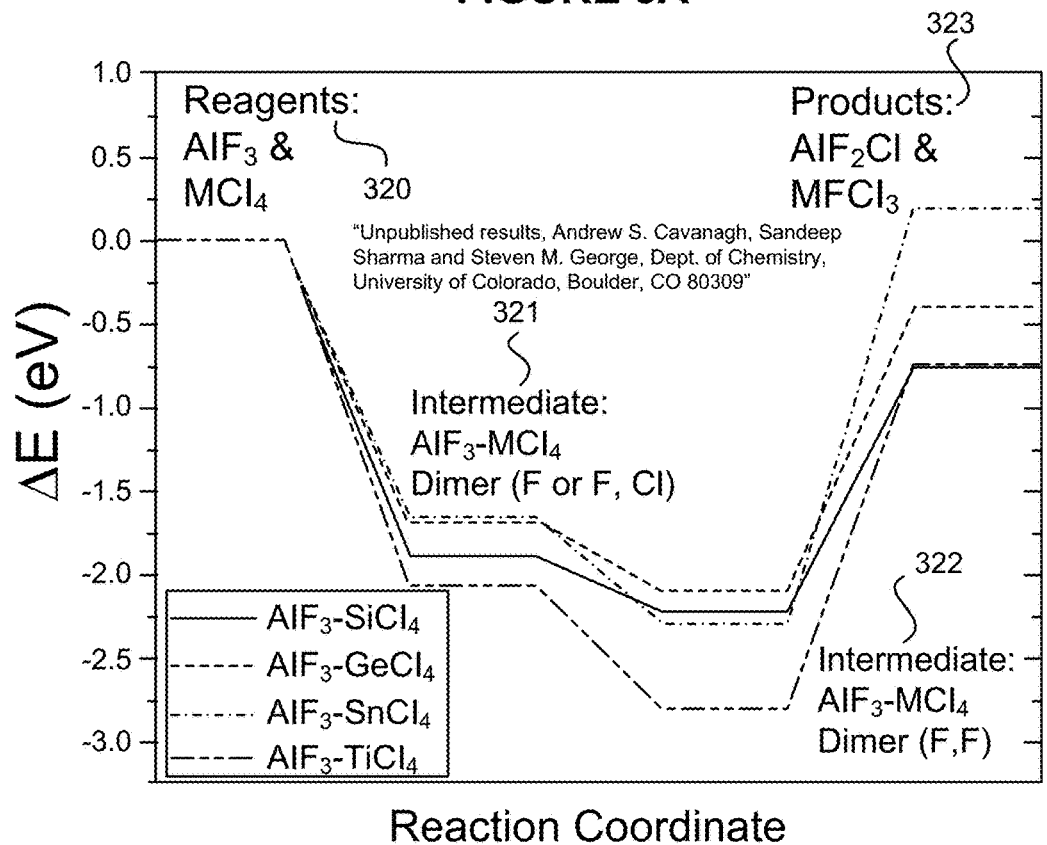
FIG. 3B shows an example energy diagram for reaction intermediates and products produced in a reaction pathway between aluminum fluoride and a metal chloride.

How stable are these possible intermediate and/or product compounds may be ascertained from an energy diagram showing energies associated with the intermediate and/or product compounds in a reaction pathway. FIG. 3B shows an example energy diagram for reaction intermediates and products produced in a reaction pathway between aluminum fluoride and a metal chloride. The energy diagram in FIG. 3B shows four different reaction pathways corresponding to four different reactions: (1) a reaction pathway for a reaction between aluminum fluoride and silicon tetrachloride, (2) a reaction pathway for a reaction between aluminum fluoride and germanium tetrachloride, (3) a reaction pathway for a reaction between aluminum fluoride and tin tetrachloride, and (4) a reaction pathway for a reaction between aluminum fluoride and titanium tetrachloride. The energy diagram shows a change in energy ($\Delta E$) as a function of a reaction coordinate representing the steps along each reaction pathway. Minimum energies in the energy diagram may be associated with different reaction intermediates or products. Accordingly, each of the different reaction intermediates and products may have an associated change in energy.

As shown in FIG. 3B, each of the reaction pathways starts with two reactants 320, namely aluminum fluoride ($AlF_3$) and metal chloride ($MCl_4$), where the two reactants 320 have an associated energy of zero. The two reactants 320 may represent an etch precursor and a surface layer in a thermal etch reaction. As each of the reaction pathways progresses, a first reaction intermediate 321 is formed with an associated energy at a first minimum of the energy diagram, and a second reaction intermediate 322 is formed with an associated energy at a second minimum of the energy diagram. The first reaction intermediate 321 may represent a dimer between the aluminum fluoride and the metal chloride having a fluorine single bridge or a fluorine and chlorine double bridge. The second reaction intermediate 322 may represent a dimer between the aluminum fluoride and the metal chloride having a fluorine and fluorine double bridge. The second reaction intermediate 322 has a lower energy minimum than the first reaction intermediate 321. As each of the reaction pathways progresses even further, reaction products 323 are formed including aluminum chloride fluoride ($AlF_2Cl$) and metal fluoride chloride ($MFCl_3$) following a ligand exchange reaction. The reaction products 323 have an associated energy greater than each of the first reaction intermediate 321 and the second reaction intermediate 322. Thus, the energy diagram shows that the second reaction intermediate 322 is the most stable compound along the reaction pathway.

An energy diagram, such as one shown in FIG. 3B, may be generated by running a simulation for a reaction between aluminum fluoride and a selected metal chloride. Though FIG. 3B shows only one reaction pathway for each thermal etch reaction, there are often multiple reaction pathways for a thermal etch reaction. In fact, the simulation may generate multiple reaction pathways for the thermal etch reaction. These distinct reaction pathways have their own associated reaction intermediates/products, associated changes in energies, and associated probabilities of occurring. The associated reaction intermediates/products, associated changes in energies, and associated probabilities of occurring generated from the simulation may provide useful information in determining the stability of certain reaction intermediates/products in a reaction pathway. This may be expressed in a reaction pattern.

Chemical characteristics of one or more reaction pathways of a thermal etch reaction may be presented in a reaction pattern. A "reaction pattern" represents potential contributions of multiple reaction pathways in a thermal etch reaction. In some embodiments, the reaction pattern may also be referred to as a "reaction fingerprint" or a "reaction signature." The reaction pattern of a thermal etch reaction may include various chemical characteristic dimensions and energy dimensions. The various chemical characteristics of the thermal etch reaction include the reaction intermediates and/or products, along with their bonding configurations and/or molecular structures. For example, the bonding configurations and/or molecular structures may include one or more of a single bridge dimer, a double bridge dimer, a triple bridge dimer, and no dimer as possible bonding configurations and/or molecular structures in a reaction pathway. In some embodiments, the reaction pattern may show the chemical characteristics along an x-axis and the energy along a y-axis. However, it will be understood that more complicated reaction patterns may show additional dimensions such as additional dimensions for temperature and/or pressure.

Figure 4:
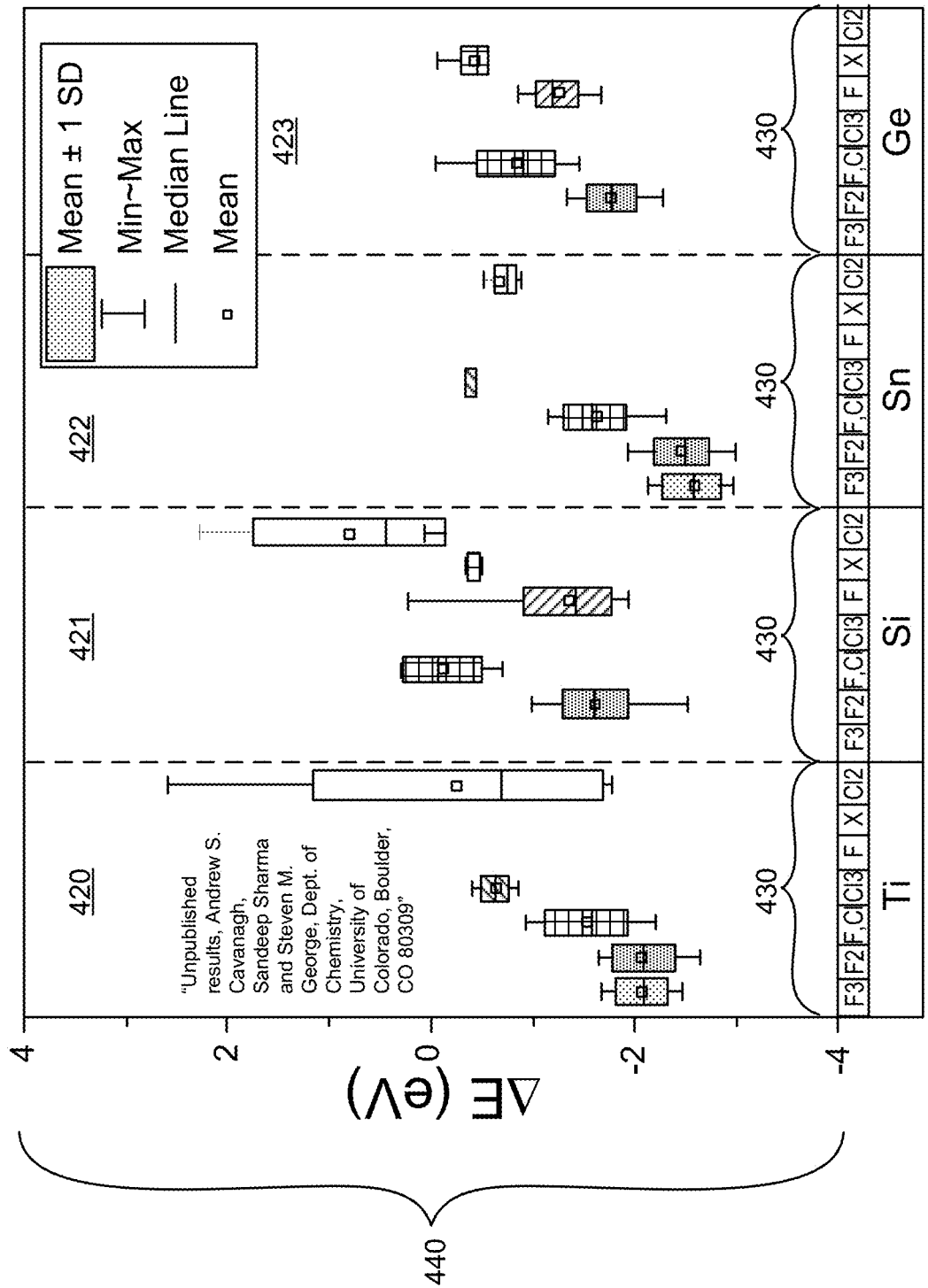
FIG. 4 shows example reaction patterns for thermal etch reactions between aluminum fluoride and various metal chlorides.

FIG. 4 shows example reaction patterns for thermal etch reactions between aluminum fluoride and various metal chlorides. The x-axis shows the chemical characteristic dimension 430 and the y-axis shows the energy dimension 440. A first reaction pattern 420 presents the chemical characteristics and associated energies in a thermal etch reaction between aluminum fluoride and titanium tetrachloride. A second reaction pattern 421 presents the chemical characteristics and associated energies in a thermal etch reaction between aluminum fluoride and silicon tetrachloride. A third reaction pattern 422 presents the chemical characteristics and associated energies in a thermal etch reaction between aluminum fluoride and tin tetrachloride. A fourth reaction pattern 423 presents the chemical characteristics and associated energies in a thermal etch reaction between aluminum fluoride and germanium tetrachloride. Simulations, such as quantum mechanical simulations, are run to generate each of the reaction patterns 420-423 for each of the thermal etch reactions. The quantum mechanical simulations trace multiple different reaction pathways and their potential contributions in the thermal etch reaction, providing for reaction intermediates and/or products and their associated energies from each of the multiple reaction pathways, which can be represented in a reaction pattern. The multiple reaction pathways may contribute multiple data sets for the reaction intermediates and/or products and their associated energies, and the multiple data sets are used to provide a mean, median line, min/max, and mean±1 standard deviation along the energy dimension 440 for each of the chemical characteristics in the chemical characteristic dimension 430. In some implementations, each of the reaction patterns 420-423 may be generated from multiple quantum mechanical simulations of a single thermal etch, where the multiple quantum mechanical simulations of the single etch reaction are run with different parameters (e.g., surface representation, initial conditions, etc.).

Commonalities in patterns and trends may be seen for different etch precursors. Specifically, patterns and trends may be ascertained and identified from the various reaction patterns 420-423 in FIG. 4. For example, the titanium tetrachloride ($TiCl_4$) in the first reaction pattern 420 and the tin tetrachloride ($SnCl_4$) in the third reaction pattern 422 share a similar "fingerprint" with respect to the formation of fluorine triple bridge configurations, fluorine double bridge configurations, and fluorine and chlorine double bridge configurations. The silicon tetrachloride ($SiCl_4$) in the second reaction pattern 421 and the germanium tetrachloride ($GeCl_4$) in the fourth reaction pattern 423 share a similar "fingerprint" with respect to the formation of fluorine double bridge configurations and fluorine/chlorine double bridge and absence of any dimer denoted by X configurations. The fluorine triple bridge configurations and fluorine double bridge configurations generally have the lowest minimum energy for the etch precursors in the first reaction pattern 420 and the third reaction pattern 422. The fluorine double bridged configurations generally have the lowest minimum energy for each of the etch precursors in reaction patterns 420-423. No fluorine single bridge configurations are present in the first reaction pattern 420 and the third reaction pattern 422. Furthermore, the energies associated with chlorine triple and chlorine double bridge configurations are generally high for reaction patterns 420-422. Some of the reaction patterns in FIG. 4 may result in etch while some of the reaction patterns in FIG. 4 do not result in etch. Experimentally, the first reaction pattern 420 and the third reaction pattern 422 resulted in etch while the second reaction pattern 421 and the fourth reaction pattern 423 did not result in etch. A human being can observe some of the trends and patterns in the reaction patterns 420-423, but it becomes increasingly complicated to recognize the trends and patterns with more etch precursors and more surface materials in the mix. In other words, it may be possible for a human mind to recognize certain trends and patterns as illustrated in FIG. 4, but over the span of many different reactions of different types, it will be extraordinarily difficult if not impossible for a human mind to discern connections between particular combinations of data points and etch information.

Adding to the complexity in discerning connections between particular combinations of data points and etch information across many different reactions of different types is obtaining the correct assumptions about the reaction pathways, the right approximation of the surface, and the starting conditions. A quantum mechanical simulation may utilize a particular quantum mechanical model, a particular assumption for representing the surface of surface-modified reactant material, and a particular assumption as to the initial conditions of the thermal etch reaction. Some particular combination of quantum mechanical models, surface representations, and initial conditions may work well for some types of thermal etch reactions and may not work well for other types of thermal etch reactions in terms of its predictive abilities.

Various quantum mechanical simulation models exist for computational generation of reaction pathways and associated energy changes. Quantum mechanical simulation models are typically used in physics, chemistry, and materials science to investigate the electronic structure of many-body systems, including atoms, molecules, and condensed phases. Quantum mechanical simulation models may be used to represent electron densities using the Schrodinger (wave) equation and calculate associated energies or potentials.

In the context of the present disclosure, the quantum mechanical simulation models may identify various reaction pathways that may exist for a given combination of an etch precursor and a surface layer. In some implementations, the surface layer is a modified surface layer. For each reaction pathway that is identified, the quantum mechanical simulation model calculates the energies of one or more reactants, products, and intermediates. In this manner, the quantum mechanical simulation model can determine energy changes ($\Delta E$) for each step in a reaction pathway.

Many different quantum mechanical simulation tools exist for modeling many-body systems and identification of various reaction pathways. These quantum mechanical simulation tools use different approximations of terms in the Schrodinger (wave) equation. Such quantum mechanical simulation tools may exist as software packages, which may or may not be commercially available. Examples include but are not limited to ABINIT, ACES, AMPAC, ADF, Atomisix ToolKit, BigDFT, CADPAC, CASINO, CASTEP, CFOUR, COLUMBUS, CONQUEST, CP2K, CPMD, CRYSTAL, DACAPO, Dalton, deMon2k, DFTB+, DFT++, DIRAC, DMol3, ELK, Empire, EPW, ErgoSCF, ERKALE, EXCITING, FLEUR, FHI-aims, FPLO, FreeON, Firefly, GAMESS, Gaussian, GPAW, HiLAPW, HORTON, HyperChem, Jaguar, JDFTx, LOWDIN, MADNESS, MISSTEP, MOLCAS, MoIDS, MOLGW, MOLPRO, MONSTERGAUSS, MOPAC, MPQC, NRLMOL, NTChem, NWChem, Octopus, ONETEP, OpenAtom, OpenMX, ORCA, phase0, PLATO, PQS, Priroda-06, PSI, PUPIL, PWmat, PWscf, PyQuante, PySCF, Qbox, Q-Chem, QMCPACK, Quantemol-N, QSite, Quantum ESPRESSO, RMG, RSPt, Scigress, Spartan, Siam Quantum, SIESTA, TB-LMTO, TeraChem, TURBOMOLE, VASP, WIEN2k, and Yambo Code. Some quantum mechanical simulation tools may include density functional theory (DFT) tools, Hartree-Fock tools, and/or semi-empirical tools. Many of the aforementioned quantum mechanical simulation tools use some category or mixture of DFT tools, Hartree-Fock tools, and semi-empirical tools, and some of the aforementioned quantum mechanical simulation tools are publicly available. For example, Gaussian uses DFT tools, Hartree-Fock tools, and semi-empirical tools. MOLPRO uses Hartree-Fock and DFT tools but not semi-empirical tools. MONSTERGAUSS uses Hartree-Fock tools but not DFT and semi-empirical tools. Atomistix ToolKit uses semi-empirical and DFT tools but not Hartree-Fock tools. Different quantum mechanical simulation tools as well as different parameterizations of a quantum mechanical simulation tool may affect the calculation and outcome, including the identification of particular reaction pathways and the energies associated with various species from the particular reaction pathways.

In addition to selecting from among different quantum mechanical simulation models in a quantum mechanical simulation of a thermal etch reaction, one of various surface representations of the surface layer may be selected in the quantum mechanical simulation. The surface representation may describe the form of the chemical species on the surface layer that participates in the thermal etch reaction with the etch precursor. As examples, the surface representation may be that of a single molecule (e.g., aluminum fluoride ($AlF_3$)) or a cluster of molecules (e.g., $[AlF_3]_x$). The cluster of molecules may be a wide range of sizes, such as large and small. As used herein, a small cluster of molecules may be less than about 20 atoms, or between about 10 atoms and about 20 atoms. For example, a small cluster of $AlF_3$ molecules would be between 3 molecules and 5 molecules. As used herein, a large cluster of molecules may be greater than about 20 atoms, greater than about 30 atoms, or greater than about 50 atoms.

Different surface representations can influence the result of the quantum mechanical simulation of a given thermal etch reaction. In some implementations, a thermal etch reaction simulated with a first surface representation may give a different reaction pattern than when simulated with a second surface representation, even if all other aspects of the reaction are identical.

In addition to selecting from among different quantum mechanical simulation models and selecting from among different surface representations of the surface layer, one of various initial conditions may be selected in the quantum mechanical simulation of the thermal etch reaction. The initial conditions may represent an initial interaction of the surface layer with the etch precursor in the quantum mechanical simulation of the thermal etch reaction. Examples of initial conditions in the quantum mechanical simulation include: separation distance between the surface layer and the etch precursor at the onset of the simulated reaction, the orientation and direction of the surface layer and the etch precursor at the onset of the simulated reaction, the form of an initial chemical bridge or bond between the surface layer and the etch precursor at the onset of the simulated reaction, and an internal or kinetic energy of the etch precursor and/or the surface layer at the onset of the simulated reaction. The aforementioned initial conditions may be specified for each quantum mechanical simulation. By way of an example, the initial conditions may assume no chemical bridge or bond between the two reactants when the initial conditions assume that the two reactants have not yet begun to chemically interact. In some implementations, the initial conditions may assume there is no separation distance between the two reactants. For example, the initial conditions may assume that the etch precursor has physisorbed and diffused on the surface of the surface layer before reacting to form a chemical bridge or bond.

Different initial conditions may influence the result of the quantum mechanical simulation of a given thermal etch reaction. As with surface representations, the energies of the species or energy changes ($\Delta E$) in the reaction pathways may be functions of the reaction's initial conditions. In some implementations, a thermal etch reaction simulated with a first initial condition may give a different reaction pattern than when simulated with a second initial condition, even if all other aspects of the reaction are identical.

Machine Learning Model

A machine learning model of the present disclosure is a trained computational model that takes chemical characteristics and associated energies for one or more reaction pathways of a simulated reaction between a surface layer and an etch precursor as inputs and provides an etch characteristic for the simulated reaction as an output. The chemical characteristics and associated energies for the one or more reaction pathways of the simulated reaction may be identified using a quantum mechanical simulation model as described above. In some implementations, the chemical characteristics and associated energies may be expressed in a reaction pattern or in multiple patterns as shown in FIG. 4. While the present disclosure refers to associated energies generated by a quantum mechanical simulation model, it will be understood that other properties may be generated by the quantum mechanical model such as associated species stabilities and/or associated species lifetimes. Such properties may be in used in addition or in the alternative to associated energies.

The chemical characteristics and associated energies, whether expressed in a reaction pattern or not, can provide data points in a simulated reaction. In some implementations, etch characteristics that may or may not be experimentally determined may provide additional data points to go with the simulated reaction. With more reactions of different types, more data points may be provided. The machine learning model of the present disclosure may be trained to recognize and find patterns between the data points across many different reactions of different types in order to accurately predict an etch characteristic of a new reaction.

Figure 5:
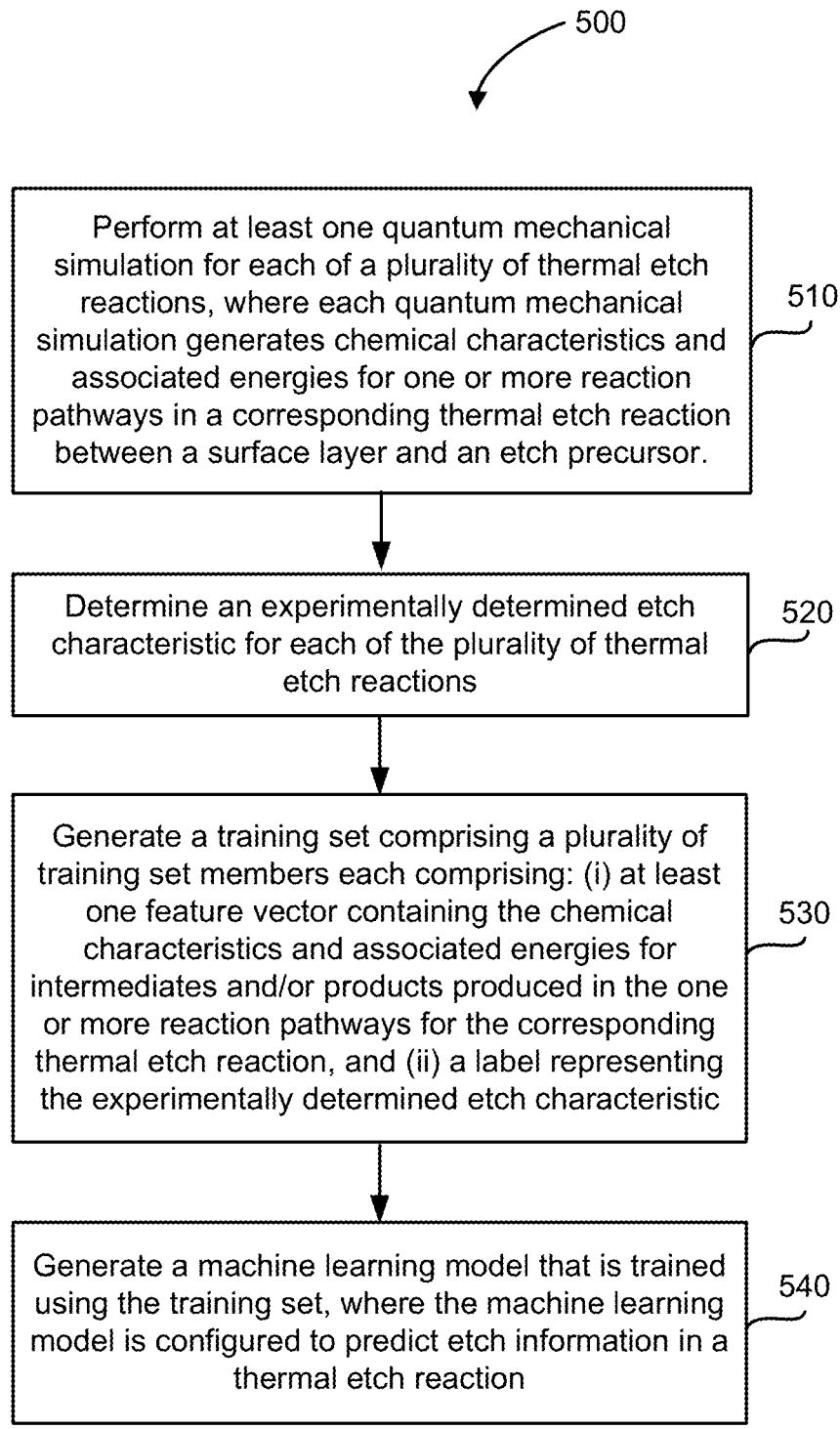
FIG. 5 is a flow diagram of an example method of generating a machine learning model for use in predicting etch information in a thermal etch reaction according to some implementations.

FIG. 5 is a flow diagram of an example method of generating a machine learning model for use in predicting etch information in a thermal etch reaction according to some implementations. The operations in a process 500 may be performed in different orders and/or with different, fewer, or additional operations. The machine learning model may be supervised, unsupervised, or partially supervised.

At block 510 of the process 500, at least one quantum mechanical simulation for each of a plurality of thermal etch reactions is performed. Each quantum mechanical simulation generates chemical characteristics and associated energies for one or more reaction pathways in a corresponding thermal etch reaction between a surface layer and an etch precursor. In some implementations, the surface layer is a modified surface layer. The generated chemical characteristics and associated energies will serve as part of training set members in a training set for training the machine learning model.

The characteristics of an etch process are typically characteristics of the reaction pathway, including chemical features of the reaction and/or the individual chemical species participating in the reaction. Descriptive of these characteristics in a reaction pathway are the chemical characteristics and associated energies (stabilities, lifetimes, etc.) of chemical species produced in the reaction pathway. Chemical characteristics may include bonding configurations or molecular structures of one or more intermediates and/or products produced in each of the one or more reaction pathways. The chemical characteristics may reflect the type of interaction between the surface layer and the etch precursor. The type of interaction can be a chemical bridge or bond between the two reactants (i.e., the surface layer and the etch precursor). In some implementations, the bonding configurations or molecular structures include one or more of a single bridge dimer, a double bridge dimer, a triple bridge dimer, and no dimer. Referring back to the example thermal etch reaction between aluminum fluoride ($AlF_3$) and a metal chloride ($MCl_4$) in FIG. 3B, a reaction intermediate can include an $AlF_3$-$MCl_4$ dimer with a single fluorine bridge, $AlF_3$-$MCl_4$ dimer with a fluorine and chlorine double bridge, or an $AlF_3$-$MCl_4$ dimer with a fluorine and fluorine double bridge. A reaction product can include no dimer in the form of $AlF_2Cl$ and $MFCl_3$.

A quantum mechanical simulation identifies various reaction pathways that may exist. For each identified pathway, the quantum mechanical simulation identifies the chemical characteristics (e.g., bonding configurations or molecular structures) of the reactants, one or more intermediates, and one or more products. Furthermore, the quantum mechanical simulation calculates the energies associated with the reactants, the one or more intermediates, and the one or more products and/or the energy changes ($\Delta E$) to reach the one or more intermediates and the one or more products from the reactants.

Such data for a quantum mechanical simulation may be expressed in a feature vector. Each feature vector contains the chemical characteristics and associated energies for intermediates and/or products produced in the one or more reaction pathways in a corresponding thermal etch reaction. In some implementations, a feature vector includes information expressed in a reaction pattern as shown in FIG. 4, though it will be understood that more complicated feature vectors may include additional information. For example, such additional information may include one or more of a temperature and pressure of the thermal etch reaction. In some implementations, a feature vector further contains one or both of a temperature and pressure of the thermal etch reaction. In some implementations, the process 500 includes organizing the chemical characteristics and associated energies for the intermediates and/or products produced in the one or more reaction pathways in the corresponding thermal etch reaction into at least one feature vector.

Multiple feature vectors may exist for a single thermal etch reaction. Specifically, separate feature vectors may be provided from different quantum mechanical simulations of a thermal etch reaction. Different quantum mechanical simulations for a thermal etch reaction may arise from different quantum mechanical models, different surface representations, and/or different initial conditions. Thus, each of the at least one quantum mechanical simulation includes a quantum mechanical model configured with a surface representation of the surface layer and one or more initial conditions. Accordingly, each feature vector of a quantum mechanical simulation may have its own unique combination of quantum mechanical models, surface representations, and initial conditions.

Figure 6A:
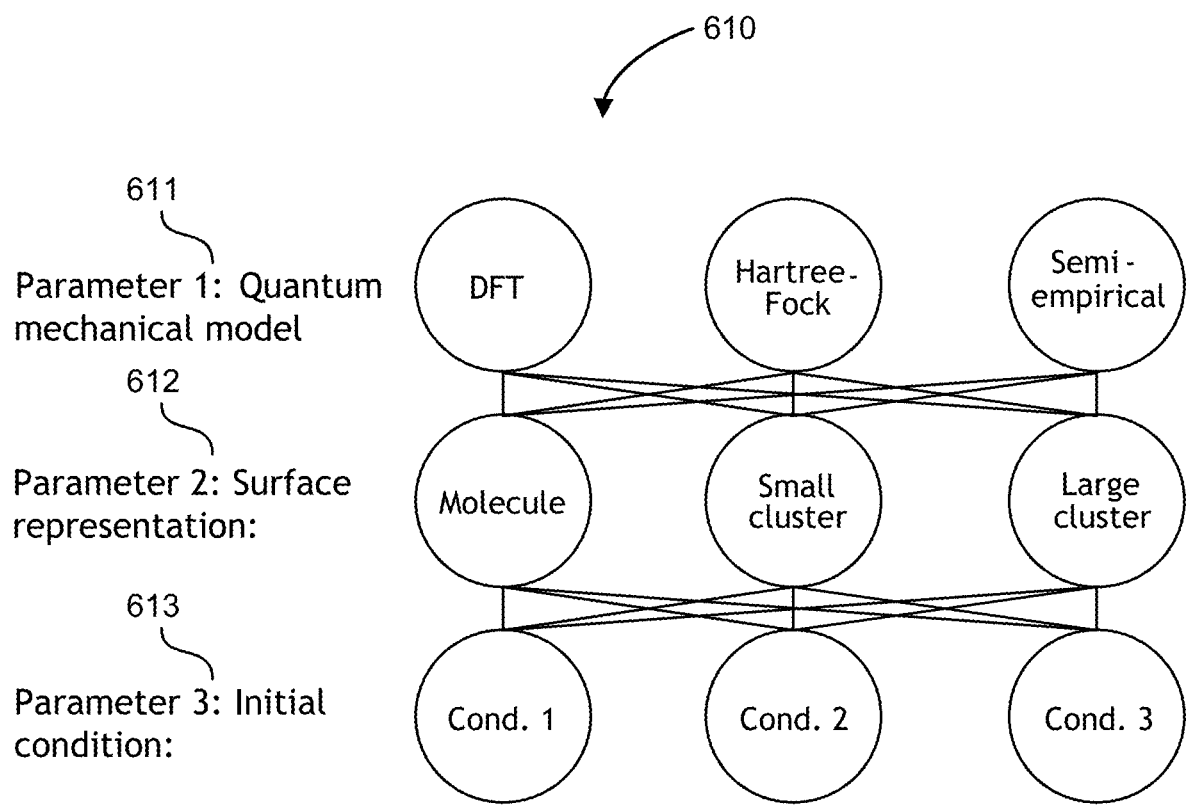
FIG. 6A shows a schematic diagram of some possible parameters in a quantum mechanical simulation for a reaction between a surface layer and an etch precursor according to some implementations.

FIG. 6A shows a schematic diagram of some possible parameters in a quantum mechanical simulation for a reaction between a surface layer and an etch precursor according to some implementations. It will be understood that a quantum mechanical simulation 610 of a thermal etch reaction is not limited to the three parameters shown in FIG. 6A, but could include different, fewer, or additional parameters. Additional parameters can include, for example, temperature or kinetic energy variations and pressure variations.

In FIG. 6A, a first parameter 611 for a quantum mechanical simulation 610 includes a quantum mechanical model. The first parameter 611 may include a quantum mechanical model selected from a DFT model, a Hartree-Fock model, a semi-empirical model, or a combination thereof. It will be understood that the quantum mechanical models are not limited to the aforementioned models and other appropriate quantum mechanical models may be utilized. Separate feature vectors for a given thermal etch reaction may be provided by simulating the thermal etch reaction using different types of quantum mechanical models. For example, one feature vector may be generated using a DFT model and another feature vector may be generated using a Hartree-Fock model. Each quantum mechanical simulation 610 provides its own set of chemical characteristics and associated energies of the thermal etch reaction.

In FIG. 6A, a second parameter 612 for a quantum mechanical simulation 610 includes a surface representation. The second parameter 612 may include a surface representation of the surface layer selected from a molecule, a small cluster of molecules, and a large cluster of molecules. It will be understood that the surface representations are not limited to the aforementioned representations and other appropriate surface representations may be utilized. Separate feature vectors for a given thermal etch reaction may be provided by simulating the thermal etch reaction using different surface representations. For example, one feature vector may be generated using a single molecule representing the surface layer and another feature vector may be generated using a small cluster of molecules representing the surface layer. These variations are provided in the quantum mechanical simulation 610.

In FIG. 6A, a third parameter 613 for a quantum mechanical simulation 610 includes initial conditions. The third parameter 613 may include a separation distance between the surface layer and the etch precursor at the onset of the quantum mechanical simulation, an orientation and/or direction of the surface layer and the etch precursor at the onset of the quantum mechanical simulation, a form of an initial chemical bridge between the surface layer and the etch precursor at the onset of the quantum mechanical simulation, an internal or kinetic energy of the etch precursor or the surface layer at the onset of the quantum mechanical simulation, or combinations thereof. It will be understood that the initial conditions are not limited to the aforementioned initial conditions and other appropriate initial conditions may be utilized. Separate feature vectors for a given thermal etch reaction may be provided by simulating the thermal etch reaction using different initial conditions. For example, one feature vector may be generated with an initial chemical bridge of a single bridge dimer and another feature vector may be generated with an initial chemical bridge of a double bridge dimer. In another example, different feature vectors may be generated with different orientations of the etch precursor. Multiple different initial conditions are provided to a quantum mechanical model with a particular surface representation for running separate simulations. In other words, a simulation is run several times, perhaps with the same simulation tool or model, so that each quantum mechanical simulation 610 is run with different initial conditions. Each initial condition provides its own feature vector.

The quantum mechanical simulation 610 of a thermal etch reaction can include additional parameters not shown in FIG. 6A. In some implementations, separate feature vectors of a given thermal etch reaction may be provided by simulating the thermal etch reaction using different temperatures or kinetic energies. In some implementations, separate feature vectors of a given thermal etch reaction may be provided by simulating the thermal etch reaction using different pressures. These variations are provided in the quantum mechanical simulation 610.

FIG. 6B shows a table of generated feature vectors from various quantum mechanical simulations run in FIG. 6A for the reaction between the surface layer and the etch precursor according to some implementations. Quantum mechanical simulations with different parameters generate different feature vectors, where the feature vectors contain at least reaction intermediates and/or products as well as their associated energy changes. The different parameters for the quantum mechanical simulations are signified in parentheses as a three-digit (abc) combination. For example, (111) corresponds to a DFT model, a single molecule for representing the surface layer, and a first initial condition, (211) corresponds to a Hartree-Fock model, a single molecule for representing the surface layer, and a first initial condition, (121) corresponds to a DFT model, a small cluster of molecules for representing the surface layer, and a first initial condition, and so on.

Each row in a table 620 corresponds to a reaction intermediate or product 630 and each column in the table 620 corresponds to an energy change ($\Delta E$) 640 associated with the reaction intermediate or product 630 for a given quantum mechanical simulation (abc). The last row in the table 620 corresponds to feature vectors 650 associated with each quantum mechanical simulation (abc). The feature vectors 650 may rank the reaction intermediates or products 630 by $\Delta E$ 640 to reflect which reaction intermediates or products 630 are stable. In some implementations, coefficients may be assigned to each of the reaction intermediates or products 630 in a particular feature vector 650 so that some reaction intermediates or products 630 are more weighted than others.

Returning to FIG. 5, at block 520 of the process 500, an experimentally determined etch characteristic is determined for each of the plurality of thermal etch reactions. The experimentally determined etch characteristic for a thermal etch reaction between a surface layer and an etch precursor may represent a desired output for the thermal etch reaction in a supervised machine learning model. In some implementations, an etch characteristic includes whether the etch precursor etches the surface layer or not. This can be indicated by a binary output. In some implementations, an etch characteristic includes an etch rate of the surface layer by the etch precursor. This can be indicated by a numerical value reflecting an etch rate, where a high etch rate value indicates that the etch precursor etches and a low etch rate value or a zero value indicates that the etch precursor does not etch. In some implementations, an etch characteristic includes some other numerical characteristic about the effectiveness of the etch precursor in etching the surface layer.

It will be understood that in some other implementations, an etch characteristic of a thermal etch reaction is not experimentally determined. For example, the etch characteristic may be determined via simulation using a reliable simulator. In some implementations, an experimentally determined etch characteristic is determined for some of the plurality of thermal etch reactions but not all of the thermal etch reactions. It is possible for the machine learning model to be trained with or without experimentally determined values. Thus, the machine learning model of the present disclosure is not necessarily limited to supervised machine learning models.

The experimentally determined etch characteristic may serve as part of a training set member in a training set for training the machine learning model. In some implementations, the process 500 further includes organizing the experimentally determined etch characteristic into a label. The labels may be provided as an indication as to whether etch will occur or not, as an etch rate, or as some other numerical characteristic about the effectiveness of the thermal etch.

The labels in a training set contain the dependent variables indicating the experimentally determined etch characteristics for the plurality of thermal etch reactions. The feature vectors in a training set contain the independent variables, where each feature vector characterizes a single thermal etch reaction. In some implementations, each feature vector characterizes a single thermal etch reaction and a single quantum mechanical simulation. In some other implementations, each feature vector characterizes a single thermal etch reaction and multiple quantum mechanical simulations of the single thermal etch reaction. A training set for training a machine learning model can be generated from feature vectors and associated labels for the plurality of thermal etch reactions.

At block 530 of the process 500, a training set comprising a plurality of training set members is generated. Each training set member comprises (i) at least one feature vector containing the chemical characteristics and associated energies for intermediates and/or products produced in the one or more reaction pathways for the corresponding thermal etch reaction, and (ii) a label representing the experimentally determined etch characteristic.

One or more training set members may be provided for each thermal etch reaction. That is, one or more combinations of a feature vector and associated label may be provided for a single thermal etch reaction. For example, one feature vector and its associated label may be provided for an aluminum fluoride and silicon tetrachloride reaction. Another feature vector and its associated label may be provided for an aluminum fluoride and germanium tetrachloride reaction. Yet another feature vector and its associated label may be provided for an aluminum fluoride and tin tetrachloride reaction. And still yet another feature vector and its associated label maybe provided for an aluminum fluoride and titanium tetrachloride reaction. The aluminum fluoride represents the surface layer and each of the metal chlorides represents the etch precursor in a thermal etch reaction. In the context of a thermal ALE reaction cycle, each of these fluorides in the aluminum fluoride may have been previously produced by a first ALE phase (e.g., conversion of aluminum oxide to aluminum trifluoride). Thus, the aluminum fluoride is a modified surface layer in a thermal ALE reaction. Each of the feature vectors and associated labels may be provided as a training set member in a training set.

Figure 6C:
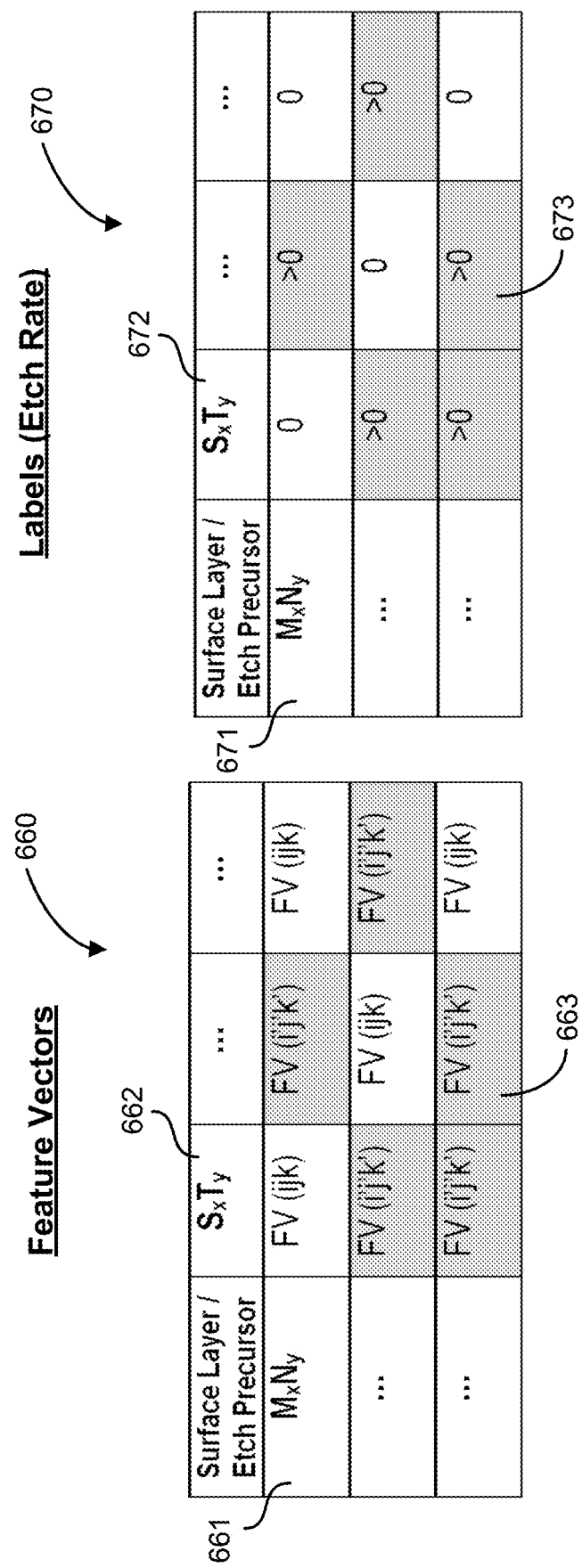
FIG. 6C shows a table of feature vectors for different thermal etch reactions and a corresponding table of labels representing etch characteristics of the different thermal etch reactions according to some implementations.

FIG. 6C shows a table of feature vectors for different thermal etch reactions and a corresponding table of labels representing etch characteristics of the different thermal etch reactions according to some implementations. A table of feature vectors 660 and a corresponding table of labels 670 may be provided as training set members in a training set for training a machine learning model.

The table of feature vectors 660 may be generated from multiple quantum mechanical simulations 610 shown in FIGS. 6A-6B that run across different thermal etch reactions. Each row in the table of feature vectors 660 includes an etch precursor $M_xN_y$ 661 in a thermal etch reaction, and each column in the table of feature vectors 660 includes a surface layer $S_xT_y$ 662 in a corresponding thermal etch reaction. Each cell in the table of feature vectors 660 includes a feature vector 663 of the thermal etch reaction between the etch precursor $M_xN_y$ 661 and the surface layer $S_xT_y$ 662, where each cell represents a different feature vector for a different thermal etch reaction. The feature vector 663 may be generated from at least one of the quantum mechanical simulations 610 run in FIGS. 6A-6B. Put another way, a particular feature vector 663 may include one of the feature vectors 650 in FIG. 6B or a combination of the feature vectors 650 in FIG. 6B for a single thermal etch reaction. The feature vector 663 contains the chemical characteristics and associated energies of reaction intermediates and/or products produced in one or more reaction pathways of a single thermal etch reaction.

The corresponding table of labels 670 may be generated experimentally, or possibly via a reliable simulator. Each row in the corresponding table of labels 670 includes an etch precursor $M_xN_y$ 671 in a thermal etch reaction, and each column in the corresponding table of labels 670 includes a surface layer $S_xT_y$ 672 in a corresponding thermal etch reaction. Each cell in the corresponding table of labels 670 includes a label 673 of the thermal etch reaction between the etch precursor $M_xN_y$ 671 and the surface layer $S_xT_y$ 672, where each cell represents a different label for a different thermal etch reaction. The label 673 may be indicative of an experimentally determined etch characteristic or predicted etch characteristic. The label 673 may include a binary value indicating whether an etch will occur or not, an etch rate, or some other numerical characteristic about the effectiveness of the etch. As shown in FIG. 6C, a label 673 shows a zero value indicating no etch between the etch precursor $M_xN_y$ 671 and the surface layer $S_xT_y$ 672, and a value greater than zero indicating etch between the etch precursor $M_xN_y$ 671 and the surface layer $S_xT_y$ 672. Where etch is indicated, a feature vector 663 in the table of feature vectors 660 is indicated with (i'j'k') and where etch is not indicated, a feature vector 663 in the table of feature vectors 660 is indicated with (ijk). The feature vectors 663 and corresponding labels 673 for a plurality of thermal etch reactions may serve as training set members in a training set.

In some implementations, training set members may be chosen in a training set over a range of thermal etch reactions (i.e., etch reaction space) where the machine learning model is expected to make accurate predictions. The accuracy and range of the machine learning model in predicting etch characteristics may depend on the selection of appropriate training set members expected to make an accurate model. By way of an example, training set members with halogenated etch precursors may be more accurate in predicting etch characteristics in a thermal etch reaction involving an etch precursor of silicon tetrachloride ($SiCl_4$) than an etch precursor involving trimethylaluminum (TMA). In some implementations, certain quantum mechanical models, surface representations, and initial conditions may provide more accurate predictions in some categories of thermal etch reactions than others. The training set members in a training set may be optimized for accurate predictions. Training set members which give poor predictions are eliminated. A methodology, such as design of experiments (DOE) based on statistical principles to ascertain what factors are more important than others, can be utilized to select training set members for such optimization. Such a DOE would not necessarily include the surface modification step to convert, for instance, Al2O3 into AlF3. Instead, Al2O3 and AlF3 samples can be exposed to the etch precursor in separate experiments.

Returning to FIG. 5, at block 540 of the process 500, a machine learning model is generated that is trained using the training set, where the machine learning model is configured to predict etch information in a thermal etch reaction. Using data points from the feature vectors containing independent variables and the labels containing dependent variables, a machine learning model may be trained to recognize patterns and predict etch information in a thermal etch reaction.

An appropriate training algorithm may be used to train the machine learning model using the training set. The training algorithm may be used to recognize patterns in the data points between the independent variables (input) and the dependent variables (output) so as to accurately predict etch information (new output) when presented with a new thermal etch reaction (new input). The training algorithm may be based on one of several machine learning algorithms. Machine learning algorithms can be divided into three broad categories: supervised learning, unsupervised learning, and reinforcement learning. While the present disclosure focuses on supervised learning, it will be understood that the machine learning model may be trained using unsupervised learning, reinforcement learning, or other suitable form of learning.

Supervised learning is useful where a property (label) is available for a certain dataset (training set). Examples of machine learning algorithms that are supervised include but are not limited to linear regression, logistic regression, decision tree, learning vector quantization, support vector machine (SVM), Naive Bayes, k-nearest neighbors, random forest, and gradient boosting. Semi-supervised learning is a type of supervised learning having a small amount of labeled data and a large amount of unlabeled data for a certain dataset. Unsupervised learning is useful where implicit relationships in a given unlabeled dataset (items are not pre-assigned) have not been discovered. An example of a machine learning algorithm that is unsupervised includes k-means. Reinforcement learning falls between supervised and unsupervised learning, where some feedback is available for each predictive step or action but there is no precise label. Rather than being presented with correct input/output pairs as in supervised learning, a given input is mapped to a reward function that an agent is trying to maximize. An example of a machine learning algorithm that is reinforcement-based includes a Markov Decision Process. Other types of learning that may fall into the one or more of the categories described above include, for example, deep learning and artificial neural networks (e.g., convolutional neural networks).

Various training tools or frameworks may exist to train the machine learning model. Examples of proprietary training tools include but are not limited to Amazon Machine Learning, Microsoft Azure Machine Learning Studio, DistBelief, Microsoft Cognitive Toolkit. Examples of open source training tools include but are not limited to Apache Singa, Caffe, H2O, PyTorch, MLPACK, Google TensorFlow, Torch, and Accord.Net.

The trained machine learning model may be used to predict etch information for a thermal etch reaction between an etch precursor and a surface layer. The trained machine learning model may take chemical characteristics and associated energies for intermediates and/or products produced in one or more reaction pathways in the thermal etch reaction as inputs and provide etch characteristics of the thermal etch reaction as outputs. In some implementations, such chemical characteristics and associated energies may be organized into a feature vector to serve as an input. In some implementations, a reaction pattern as shown in FIG. 4 for a single thermal etch reaction may serve as an input.

The trained machine learning model may take one of several forms. In some implementations, the trained machine learning model is a classification and regression tree or a random forest tree. In some implementations, the trained machine learning model is an artificial neural network, such as a convolutional neural network. In some implementations, the trained machine learning model is a linear classifier, such as a linear regression, logistic regression, or support vector machine.

In situations where it is unclear or unknown whether a given etch precursor etches a surface layer, how fast or how slow a given etch precursor etches a surface layer, how selective is a given etch precursor in etching a surface layer, or how effective is an etch precursor in etching a surface layer, the machine learning model of the present disclosure may be trained to accurately predict such etch information. Etch information may include, for example, whether the etch precursor etches the surface layer or not, an etch rate of the surface layer by the etch precursor, or some other numerical value indicative of the effectiveness of the etch precursor in etching the surface layer. This can be useful in determining the selectivity of an etch precursor in the presence of various materials on a surface of a substrate.

In some implementations, the machine learning model of the present disclosure may be useful in identifying candidate thermal etch reactions, including candidate thermal ALE reactions. For example, where a substrate contains multiple different materials that will be simultaneously exposed to an etch precursor, the machine learning model may identify what combination of etch precursors and/or surface layers will provide a desired selectivity in a given application. In some implementations, the machine learning model of the present disclosure may be useful in identifying candidate etch masks. For example, the machine learning model may identify what materials on a substrate will resist etch and can serve as an etch mask for a given etch precursor. In some implementations, the machine learning model of the present disclosure may be useful in identifying chamber materials that resist etch for a given etch precursor. That way, chamber walls and other components are not inadvertently etched by the etch precursor. In some implementations, the machine learning model may be useful in designing a new etch process or reactor design by identifying one or more of the following: (i) candidate thermal etch reactions, (ii) candidate etch mask materials, and (iii) candidate chamber materials.

Figure 7:
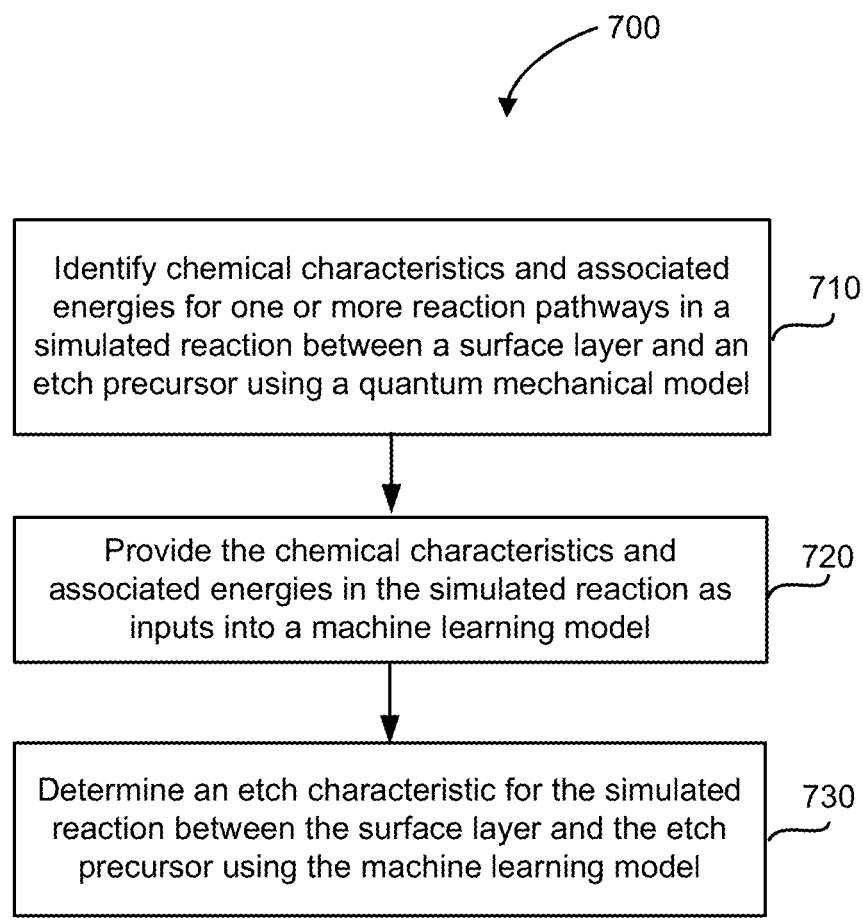
FIG. 7 is a flow diagram of an example method for predicting an etch characteristic in a reaction between a surface layer and an etch precursor according to some implementations.

FIG. 7 is a flow diagram of an example method for predicting an etch characteristic in a reaction between a surface layer and an etch precursor according to some implementations. The operations in a process 700 may be performed in different orders and/or with different, fewer, or additional operations.

At block 710 of the process 700, chemical characteristics and associated energies for one or more reaction pathways in a simulated reaction between a surface layer and an etch precursor are identified using a quantum mechanical model. In some implementations, the surface layer is a modified surface layer following a first phase of a thermal ALE reaction. In some implementations, the chemical characteristics include bonding configurations or molecular structures of one or more reaction intermediates and/or products produced in the one or more reaction pathways. In some implementations, the bonding configurations or molecular structures include one or more of a single bridge dimer, a double bridge dimer, a triple bridge dimer, and no dimer. Such bonding configurations or molecular structures are shown in FIG. 3A. Possible reaction intermediates and/or products produced in a reaction pathway and their associated energies may be shown in an energy diagram. An example of an energy diagram showing four different reaction pathways for four different thermal etch reactions is shown in FIG. 3B. In some implementations, the chemical characteristics and associated energies may be expressed in a reaction pattern. An example of four different reaction patterns is shown in FIG. 4.

In some implementations, the process 700 further includes organizing the chemical characteristics and the associated energies for the one or more reaction pathways of the simulated reaction into a feature vector. As described earlier, a feature vector contains at least the chemical characteristics and the associated energies for the one or more reaction pathways of the simulated reaction.

The chemical characteristics and associated energies for the one or more reaction pathways in the simulated reaction are determined using the quantum mechanical model configured with a selected surface representation of the surface layer and one or more selected initial conditions. It will be understood, however, that the quantum mechanical model may be configured with different, fewer, or additional parameters. In some implementations, the one or more selected initial conditions include a separation distance between the surface layer and the etch precursor at the onset of the simulated reaction, an orientation and/or direction of the surface layer and the etch precursor at the onset of the simulated reaction, a form of an initial chemical bridge between the surface layer and the etch precursor at the onset of the simulated reaction, an internal or kinetic energy of the etch precursor or the surface layer at the onset of the simulated reaction, or combinations thereof. It will be understood, however, that the initial conditions are not limited to the aforementioned initial conditions and other initial conditions may be configured or adjusted for the quantum mechanical model. In some implementations, the selected surface representation of the surface layer is selected from a group consisting of: a molecule, a small cluster of molecules, and a large cluster of molecules. In some implementations, the quantum mechanical model includes a density functional theory (DFT) model, a Hartree-Fock model, a semi-empirical model, or combinations thereof. For each quantum mechanical simulation with its own unique combination of the quantum mechanical model, selected surface representation, and one or more selected initial conditions, separate feature vectors may be generated. In some implementations, the quantum mechanical model, the surface representation, and the initial conditions may be selected to optimize accuracy of prediction.

At block 720 of the process 700, the chemical characteristics and associated energies in the simulated reaction are provided as inputs into a machine learning model. Other characteristics of the simulated reaction may be provided as inputs into the machine learning model. In some implementations, the inputs may further include one or both of a temperature and a pressure of the simulated reaction.

In some implementations, the machine learning model may be trained according to a process 500 described in FIG. 5. In some implementations, the machine learning model was trained using a training set comprising a plurality of training set members each comprising (i) a feature vector containing chemical characteristics and associated energies for intermediates and/or products produced in one or more reaction pathways for a thermal etch reaction simulated by at least one quantum mechanical simulation, and (ii) a label representing a characteristic of the thermal etch reaction. Each training set member includes at least one feature vector for a given thermal etch reaction and an associated label. In some implementations, a particular training set member may include multiple feature vectors across multiple quantum mechanical simulations for a given thermal etch reaction. Each of the feature vectors may include a unique combination of: a specified etch precursor, a specified surface layer, a specified quantum mechanical model, a specified surface representation of the specified surface layer, and one or more specified initial conditions. The machine learning model may be trained to recognize patterns across the training set members in the training set to be able to accurately predict an etch characteristic of the simulated reaction. The machine learning model may be trained using any suitable training algorithm including any of the training algorithms described above.

At block 730 of the process 700, an etch characteristic for the simulated reaction between the surface layer and the etch precursor is determined using the machine learning model. In some implementations, the etch characteristic for the simulated reaction includes an etch rate of the surface layer. In some implementations, the etch characteristic for the simulated reaction includes an indication whether the surface layer is etched or not.

In some implementations, the machine learning model may be validated against experimentally measured values. In some implementations, the process 700 further includes validating the determined etch characteristic for the simulated reaction based on an experimentally measured value of the etch characteristic. This can be done by comparing the etch characteristic determined at block 730 of the process 700 to an experimentally measured value of the etch characteristic. The machine learning model may continue to learn and be trained with such feedback so as to improve its prediction accuracy.

Figure 8:
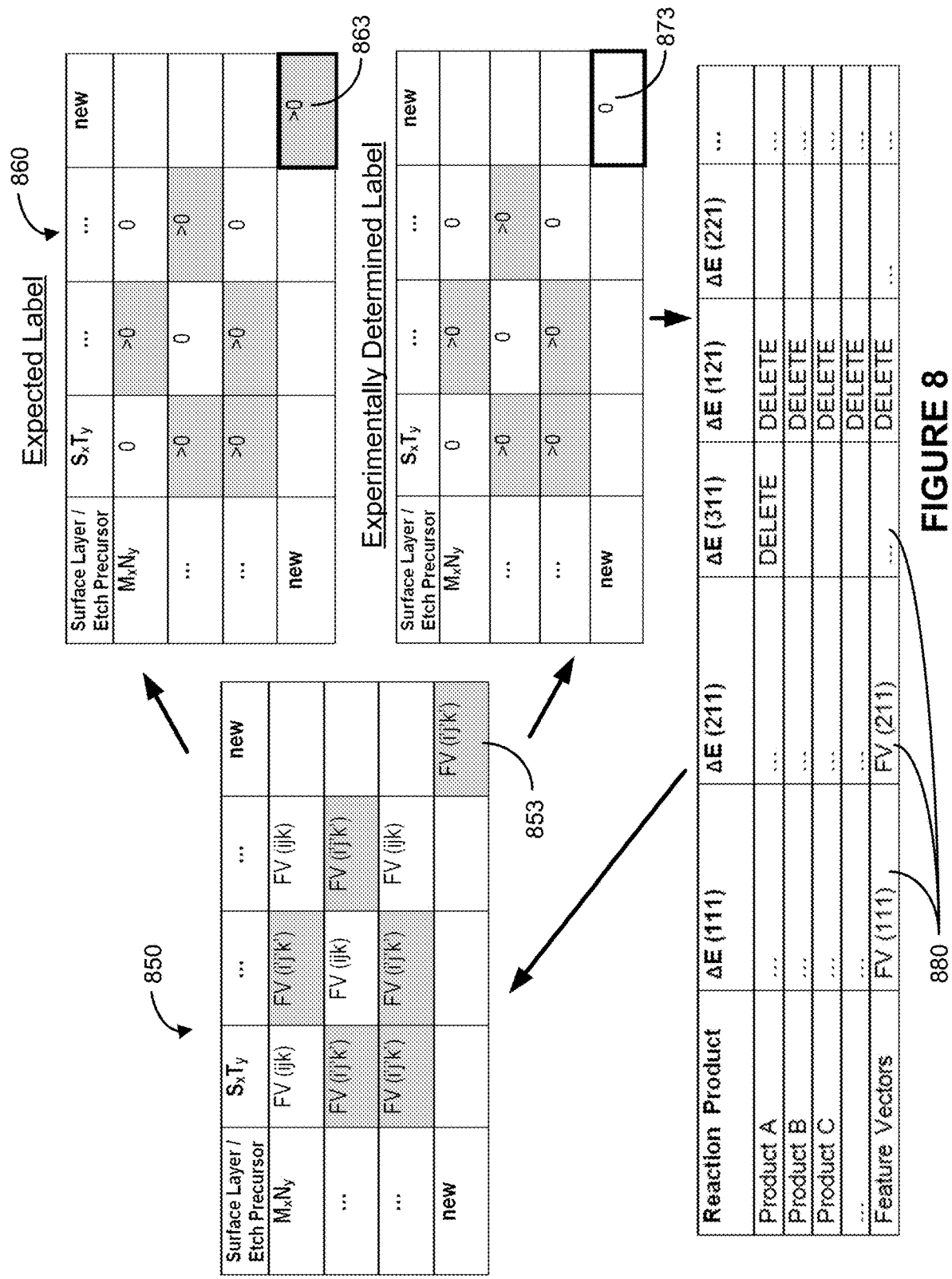
FIG. 8 shows a schematic diagram of validating a machine learning model from an experimentally measured value according to some implementations.

FIG. 8 shows a schematic diagram of validating a machine learning model from an experimentally measured value according to some implementations. A machine learning model may use a table of feature vectors 850 and a corresponding table of labels 860 to predict an etch characteristic 863 for a new thermal etch reaction between a new etch precursor and a new surface layer. The table of feature vectors 850 and the corresponding table of labels 860 may include a training set that encompasses a particular span of etch reactions. A new feature vector 853 may be generated from at least one quantum mechanical simulation of the new thermal etch reaction and may be provided in the table of feature vectors 850. The machine learning model predicts an expected label as indicated by the etch characteristic 863 in the corresponding table of labels 860. The etch characteristic 863 is compared to an experimentally measured value or experimentally determined label 873 to verify the accuracy of the prediction. A set of feature vectors 880 used in generating the table of feature vectors 850 is adjusted to maximize prediction success based on the feedback provided after comparing the etch characteristic 863 to the experimentally determined label 873. The set of feature vectors 880 may be generated from multiple quantum mechanical simulations across different parameters for each thermal etch reaction. What parameters are used and what quantum mechanical simulations are used in the set of feature vectors 880 for generating the training set will be adjusted according to the feedback from the experimentally determined label 873.

The machine learning model may receiving ongoing training or improvements using feedback from new measurements of etch that confirm or reject results predicted by the machine learning model. Feedback to the machine learning model may not only come in the form of new measurements of etch, but possibly in the form of identified reaction intermediates and/or products in a thermal etch reaction. For example, such feedback may be received from mass spectrometers or other instruments outfitted in a reactor or chamber. The feedback may be used to further refine the parameters and the quantum mechanical simulations used in generating feature vectors for a given training set. In other words, the parameters and the quantum mechanical simulations used in generating feature vectors may be refined based on experimentally determined reaction intermediates and/or products. In some implementations, mass spectrometers or other instruments outfitted with the reactor may be integrated with software used for the machine learning model so as to provide ongoing training.

In some implementations, the machine learning model may be used to design a thermal etch process or thermal ALE process. Specifically, the machine learning model may be used to identify candidate thermal etch reactions with etch precursors and/or surface layers that achieve a desired selectivity and etch rate, candidate etch mask materials, and candidate chamber materials to resist etch for a given etch chemistry. In some implementations, the process 700 in FIG. 7 further includes identifying one or more candidate thermal etch reactions using the machine learning model, where each of the one or more identified candidate thermal etch reactions includes at least an identified etch precursor. Each of the one or more identified candidate thermal reactions further includes an identified material to be etched by the identified etch precursor, an identified etch mask material, and/or an identified chamber material. The machine learning model may identify combinations of materials for thermally etching at a desirable selectivity without having to go through undue amounts of experimentation.

FIG. 9 shows a table of feature vectors for different thermal etch reactions with identified etch precursors and identified surface layers for designing candidate thermal etch reactions according to some implementations. The table of feature vectors 950 includes rows of etch precursors 951 and columns of surface layers 952. For a given etch precursor 951, a pair of surface layers 960 may be identified, one surface layer that etches and one surface layer that does not etch. By way of an example, if the pair of surface layers 960 varies by a single element (e.g., $Al_2O_3$ and $AlF_3$), then a surface modification step may be designed to produce the pair of surface layers 960 so that one surface layer is modified and the other surface layer remains as bulk material. That way, the etch precursor 951 may selectively etch the modified surface layer without etching the bulk material.

Conclusion

In the foregoing description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments are described in conjunction with the specific embodiments, it will be understood that it is not intended to limit the disclosed embodiments.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method for predicting an etch characteristic in a reaction between a surface layer and an etch precursor, the method comprising:
   (a) identifying chemical characteristics and associated energies for one or more reaction pathways in a simulated reaction between the surface layer and the etch precursor using a quantum mechanical model;
   (b) providing the chemical characteristics and associated energies in the simulated reaction as inputs into a machine learning model;
   (c) determining an etch characteristic for the simulated reaction between the surface layer and the etch precursor using the machine learning model; and
   (d) generating, based on the etch characteristic, an output that comprises one or both of: etch reaction(s) and material(s), wherein the output is used at least in part to perform an etch.

2. The method of claim 1, wherein the chemical characteristics and associated energies for the one or more reaction pathways in the simulated reaction are determined using the quantum mechanical model configured with a selected surface representation of the surface layer and one or more selected initial conditions.

3. The method of claim 2, wherein the one or more selected initial conditions include a separation distance between the surface layer and the etch precursor at an onset of the simulated reaction, an orientation and/or direction of the surface layer and the etch precursor at the onset of the simulated reaction, a form of an initial chemical bridge between the surface layer and the etch precursor at the onset of the simulated reaction, an internal or kinetic energy of the etch precursor or the surface layer at the onset of the simulated reaction, or combinations thereof.

4. The method of claim 2, wherein the selected surface representation of the surface layer is selected from a group consisting of: a molecule, a small cluster of molecules, and a large cluster of molecules.

5. The method of claim 1, wherein the quantum mechanical model includes a density functional theory (DFT) model, a Hartree-Fock model, a semi-empirical model, or combinations thereof.

6. The method of claim 1, wherein the inputs include one or both of a temperature and pressure of the simulated reaction.

7. The method of claim 1, wherein the chemical characteristics include bonding configurations or molecular structures of one or more reaction intermediates and/or products produced in the one or more reaction pathways.

8. The method of claim 1, further comprising:
   performing the etch based at least in part on the output.

9. The method of claim 1, wherein the etch characteristic for the simulated reaction includes an etch rate of the surface layer.

10. The method of claim 1, wherein the etch characteristic for the simulated reaction includes an indication whether the surface layer is etched or not.

11. The method of claim 1, further comprising:
   organizing the chemical characteristics and the associated energies for the one or more reaction pathways of the simulated reaction into a feature vector.

12. The method of claim 1, wherein the machine learning model was trained using a training set comprising a plurality of training set members, each training set member comprising (i) a feature vector containing chemical characteristics and associated energies for intermediates and/or products produced in one or more reaction pathways for a thermal etch reaction simulated by at least one quantum mechanical simulation, and (ii) a label representing a characteristic of the thermal etch reaction.

13. The method of claim 12, wherein each of the feature vectors includes a unique combination of: a specified etch precursor, a specified modified surface layer, a specified quantum mechanical model, a specified surface representation of the specified modified surface layer, and one or more specified initial conditions.

14. The method of claim 1, further comprising:
   validating the determined etch characteristic for the simulated reaction based on an experimentally measured value of the etch characteristic.

15. The method of claim 1, further comprising:
identifying one or more candidate thermal etch reactions using the machine learning model, wherein each of the one or more identified candidate thermal etch reactions includes at least an identified etch precursor.

16. The method of claim 15, wherein each of the one or more identified candidate thermal etch reactions further includes an identified material to be etched by the identified etch precursor, an identified etch mask material, and/or an identified chamber material.

17. A method of generating a machine learning model for use in predicting etch information in a thermal etch reaction:
performing at least one quantum mechanical simulation for each of a plurality of thermal etch reactions, each quantum mechanical simulation generating chemical characteristics and associated energies for one or more reaction pathways in a corresponding thermal etch reaction between a surface layer and an etch precursor;
determining, for each of the plurality of thermal etch reactions, an experimentally determined etch characteristic;
generating a training set comprising a plurality of training set members, each training set member comprising (i) at least one feature vector containing the chemical characteristics and associated energies for intermediates and/or products produced in the one or more reaction pathways for the corresponding thermal etch reaction, and (ii) a label representing the experimentally determined etch characteristic;
generating the machine learning model trained using the training set, wherein the machine learning model is configured to predict the etch information in the thermal etch reaction; and
generating, based on the etch information, an output comprising one or both of: etch reaction(s) and material(s), wherein the output is used at least in part to perform an etch.

18. The method of claim 17, wherein the machine learning model is a classification and regression tree, a random forest tree, an artificial neural network, a linear regression, a logistic regression, or a support vector machine.

19. The method of claim 17, wherein performing the at least one quantum mechanical simulation comprises performing multiple quantum mechanical simulations for each of the plurality of thermal etch reactions, and wherein each feature vector contains the chemical characteristics and associated energies for intermediates and/or products produced in the one or more reaction pathways from one of the multiple quantum mechanical simulations of the corresponding thermal etch reaction.

20. The method of claim 17, wherein each of the at least one quantum mechanical simulation includes a quantum mechanical model configured with a surface representation of the surface layer and one or more initial conditions.

21. The method of claim 20, wherein the one or more initial conditions include a separation distance between the surface layer and the etch precursor at an onset of the quantum mechanical simulation, an orientation and/or direction of the surface layer and the etch precursor at the onset of the quantum mechanical simulation, a form of an initial chemical bridge between the surface layer and the etch precursor at the onset of the quantum mechanical simulation, an internal or kinetic energy of the etch precursor or the surface layer at the onset of the quantum mechanical simulation, or combinations thereof.

22. The method of claim 20, wherein the surface representation of the surface layer is selected from a group consisting of: a molecule, a small cluster of molecules, and a large cluster of molecules.

23. The method of claim 20, wherein the quantum mechanical model includes a density functional theory (DFT) model, a Hartree-Fock model, a semi-empirical model, or combinations thereof.

24. The method of claim 17, wherein each feature vector further contains one or both of a temperature and pressure of the corresponding thermal etch reaction.

25. The method of claim 17, wherein the chemical characteristics include bonding configurations or molecular structures of the intermediates and/or products produced in the one or more reaction pathways.

26. The method of claim 17, further comprising:
performing the etch based at least in part on the output.

27. The method of claim 17, wherein generating the training set comprises:
organizing the chemical characteristics and associated energies for the one or more reaction pathways in the corresponding thermal etch reaction into the at least one feature vector; and
organizing the experimentally determined etch characteristic into the label.

* * * * *